United States Patent
Tanaka

(10) Patent No.: US 8,749,879 B2
(45) Date of Patent: Jun. 10, 2014

(54) SEMICONDUCTOR OPTICAL AMPLIFIER AND OPTICAL AMPLIFICATION APPARATUS

(75) Inventor: Shinsuke Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 502 days.

(21) Appl. No.: 13/099,625

(22) Filed: May 3, 2011

(65) Prior Publication Data

US 2011/0273765 A1 Nov. 10, 2011

(30) Foreign Application Priority Data

May 7, 2010 (JP) ................... 2010-107428

(51) Int. Cl.
*H01S 5/30* (2006.01)
(52) U.S. Cl.
USPC ........................................... 359/344
(58) Field of Classification Search
USPC .................................. 359/344, 337
See application file for complete search history.

(56) References Cited

U.S. PATENT DOCUMENTS

| 5,208,822 | A | * | 5/1993 | Haus et al. ................ 372/50.1 |
| 5,239,410 | A | * | 8/1993 | Nishimura et al. .......... 359/344 |
| 5,657,157 | A | * | 8/1997 | Lang et al. ................. 359/344 |
| 7,274,010 | B2 | * | 9/2007 | Matsuda et al. ......... 250/214 LA |

FOREIGN PATENT DOCUMENTS

| JP | 3-287237 A | 12/1991 |
| JP | 2002-151794 A | 5/2002 |

\* cited by examiner

*Primary Examiner* — Mark Hellner
(74) *Attorney, Agent, or Firm* — Fujitsu Patent Center

(57) ABSTRACT

A semiconductor optical amplifier includes a semiconductor substrate, a lower cladding layer formed on the semiconductor substrate, a light absorption layer and an optical amplification layer formed on the lower cladding layer, and an upper cladding layer formed on the light absorption layer and the optical amplification layer. The band gap of a semiconductor material that forms the light absorption layer is wider than the band gap of a semiconductor material that forms the optical amplification layer. The difference between the band gap of the semiconductor material that forms the light absorption layer and the band gap of the semiconductor material that forms the optical amplification layer is 0.12 eV or more.

16 Claims, 33 Drawing Sheets

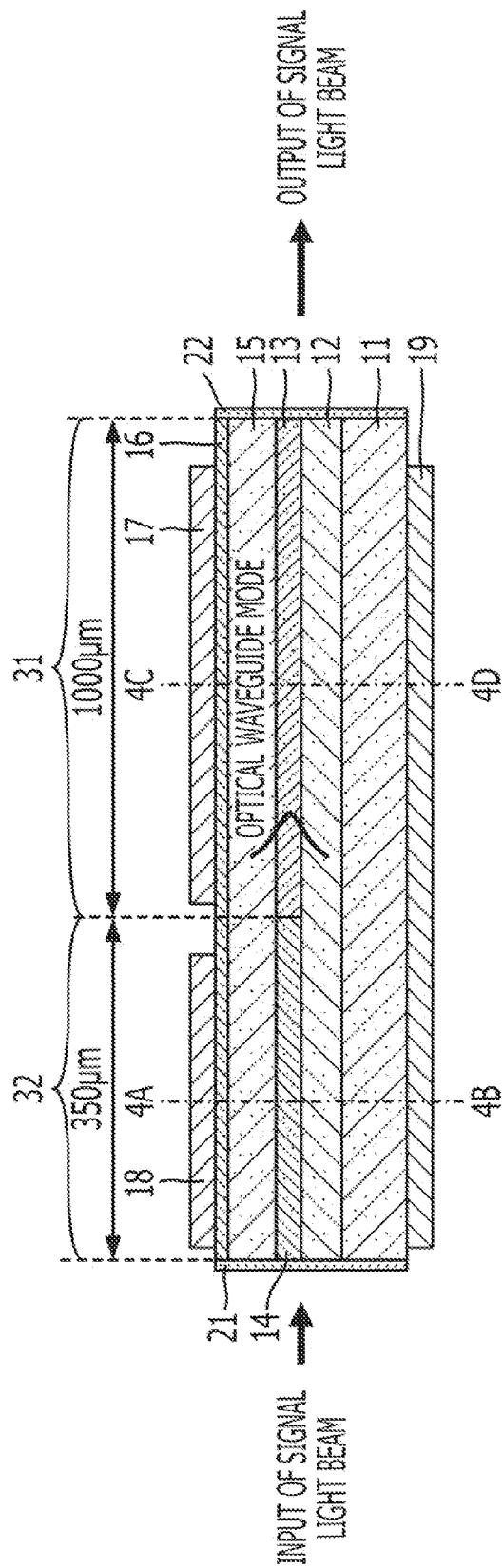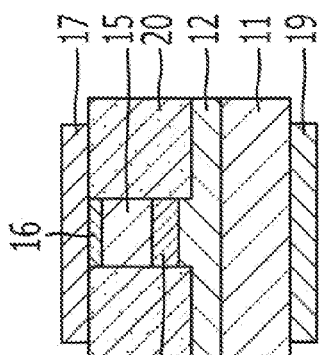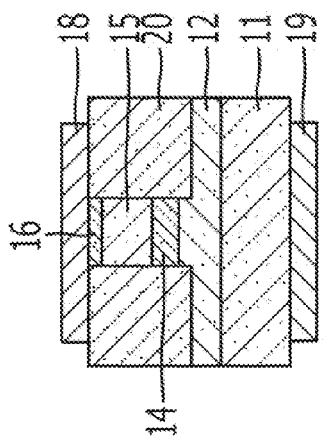

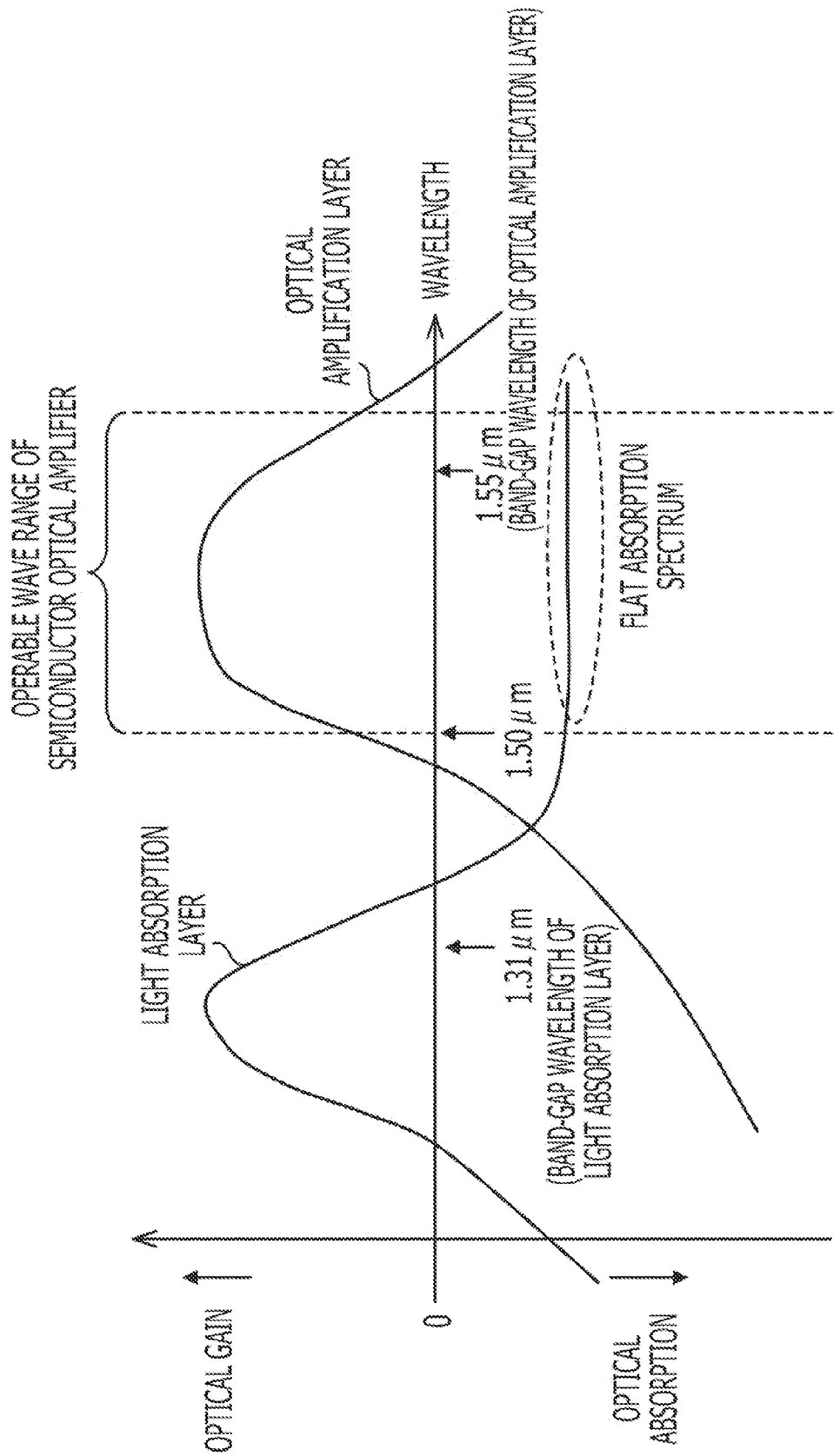

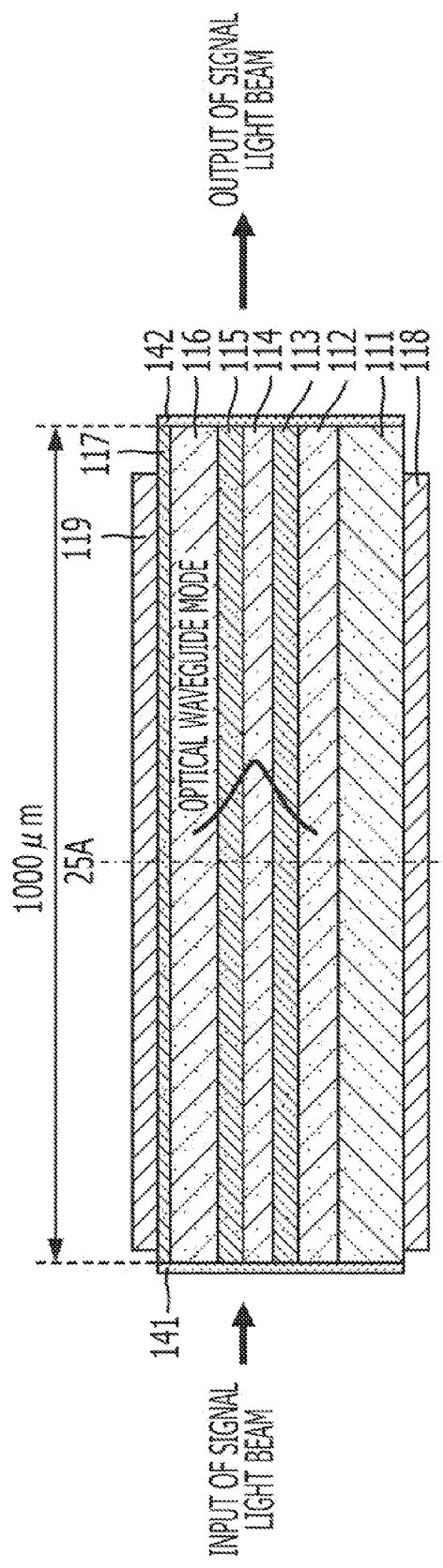
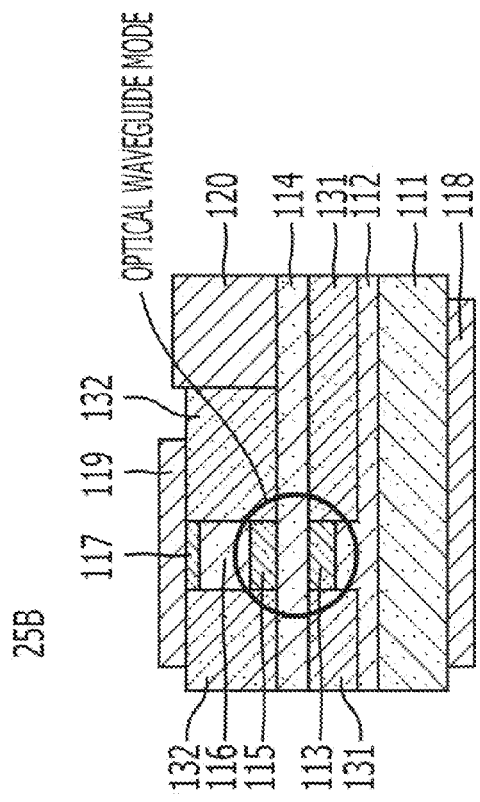
FIG. 25A
FIG. 25B

SEMICONDUCTOR OPTICAL AMPLIFIER AND OPTICAL AMPLIFICATION APPARATUS

CROSS-REFERENCE TO RELATED APPLICATIONS

This application is based upon and claims the benefit of priority of the prior Japanese Patent Application No. 2010-107428, filed on May 7, 2010 the entire contents of which are incorporated herein by reference.

FIELD

The present invention relates to a semiconductor optical amplifier and an optical amplification apparatus.

BACKGROUND

With the dramatic increase in communication demand in recent years, the use of large capacity and high-speed photonic networks has increased in access networks for transferring data between base stations of carriers and user sites. Wavelength Division Multiplex (WDM) systems have been studied for the replacement of conventional Time Division Multiplex (TDM) systems and are coming into practical use as next generation optical access network systems.

A Semiconductor Optical Amplifier (SOA) is as an attractive device to be used in such a WDM system. Comparing with an optical fiber amplifier module most commonly used nowadays, the configuration of the SOA is very simple and advantageous in dimensions and amplification wavelength bandwidth. Thus, the application of the SOA in various kinds of photonic networks such as a next generation optical access networks has been studied. Therefore, a semiconductor optical amplifier and an optical amplification apparatus with low polarization dependences are desired.

Related art is disclosed in Japanese Laid-open Patent Publication No. hei3-287237, and Japanese Laid-open Patent Publication No. 2002-151794.

SUMMARY

According to one aspect of the invention, a semiconductor optical amplifier includes a semiconductor substrate, a lower cladding layer formed on the semiconductor substrate, a light absorption layer and an optical amplification layer formed on the lower cladding layer, and an upper cladding layer formed on the light absorption layer and the optical amplification layer. The band gap of a semiconductor material that forms the light absorption layer is wider than the band gap of a semiconductor material that forms the optical amplification layer. The difference between the band gap of the semiconductor material that forms the light absorption layer and the band gap of the semiconductor material that forms the optical amplification layer is 0.12 eV or more.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A to 4C are structural diagrams of a semiconductor optical amplifier according to a first embodiment;

FIG. 5 is an explanatory diagram of a semiconductor optical amplifier according to the first embodiment;

FIGS. 25A and 25B are manufacturing process diagrams of a semiconductor optical amplifier according to a second embodiment;

DETAILED DESCRIPTION OF THE EMBODIMENTS

Embodiments will be described below.

First, in order to facilitate understanding of the following examples, a change in wavelength dependence of gain with a change in SOA driving current will be described. A SOA to be applied to a photonic network requires a gain control operation for controlling SOA gain in response to a control signal from the outside. Since an increase in optical gain of the SOA generally depends on a driving current, an optical gain control of the SOA is mainly performed by controlling and adjusting the driving current. When using this kind of SOA in a WDM system, collectively amplifying a plurality of signal beams of different wavelengths is desired.

Figure 1:
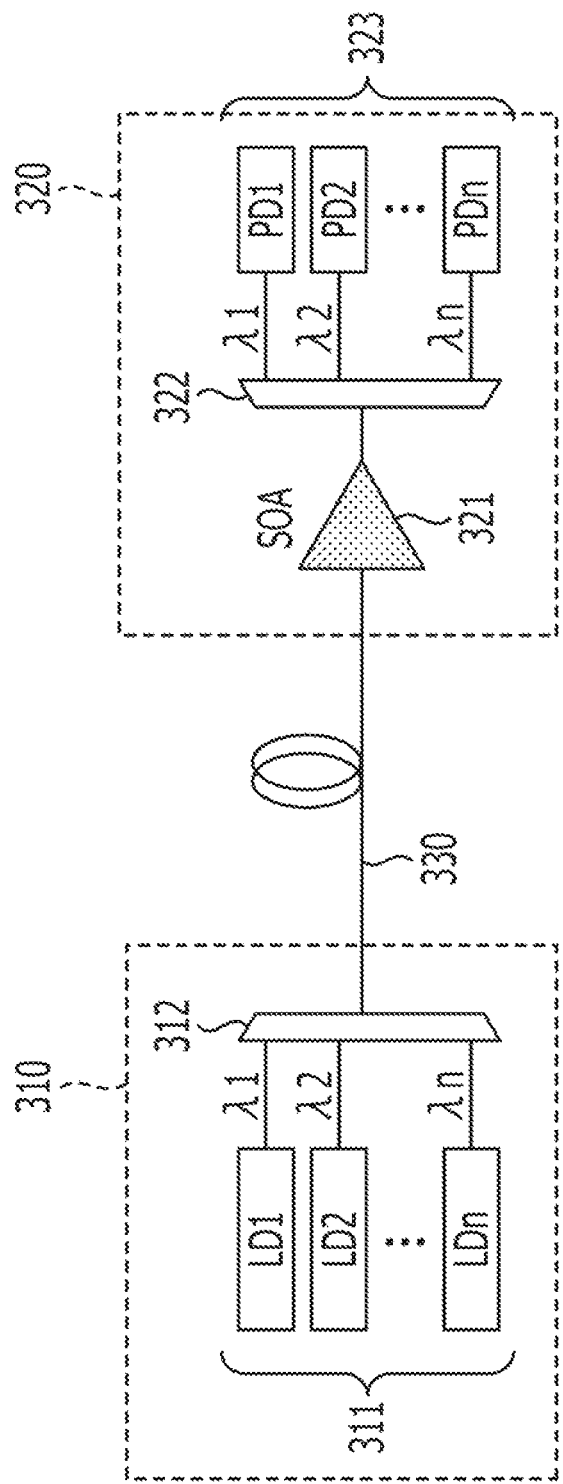
FIG. 1 is a structural diagram of a WDM system using a semiconductor optical amplifier.

A SOA-based WDM system will be described with reference to FIG. 1. In the WDM system, a transmitter 310 and a receiver 320 are connected to a fiber transmission path 330 with an optical fiber. The transmitter 310 includes a plurality of modulator-integrated lasers 311. These modulator-integrated layers 311 are connected to an Arrayed-Waveguide Grating (AWG) multiplexer 312. The AWG multiplexer 312 is connected to a fiber transmission path 330. The modulator-integrated layers 311 have their respective oscillation wavelengths which are different from one another. In other words, the modulator-integrated lasers 311 have respective oscillation wavelengths of $\lambda 1, \lambda 2, \ldots,$ and $\lambda n$, which are different from one another. In the AWG multiplexer 312, light beams modulated by the respective modulator-integrated lasers 311 are multiplexed and then transmitted as a Wavelength Division Multiplexed (WDM) signal to a fiber transmission path 330. In this case, the outputs from the respective modulator-integrated lasers 311 are adjusted so as to be substantially equal to one another. The WDM signal transmitted through the fiber transmission path 330 is received by the receiver 320. The WDM signal received on the receiver 320 is demultiplexed into optical signals of the respective wavelengths by an AWG demultiplexer 322 after collectively amplifying the light intensities of optical signals of the respective wavelengths by the SOA 321. The demultiplexed optical signals of the respective wavelengths are input into optical detectors 323 corresponding to the respective wavelengths, where the optical signals of the respective wavelengths are converted into electric signals of the respective wavelengths.

In such a WDM system, if the signal beam wavelength dependence or polarization dependence of optical gain in the SOA 321 is high, the optical signals to be input into the respective optical detectors 323 will cause a significant level difference in light intensity and an equal transmission characteristic through the entire WDM signal will no longer be acquired. That is, in the usual SOA 321, a change in optical gain leads to a significant change in dependence of optical gain on signal beam wavelength. In the aforementioned WDM system, therefore, when the usual SOA 321 is used and an amplification factor is changed by changing a driving current, an amplification factor may vary greatly with different wavelengths. Thus, if the amplification factor of the SOA 321 varies greatly with different wavelengths, the intensity of light emitted from the SOA 321 will vary greatly at different wavelengths. Thus, if the light intensities at the respective wavelengths differ greatly from one another, the optical detector 323 may fail in the correct detection and demodulation of optical signals of the respective wavelengths.

Figure 2:
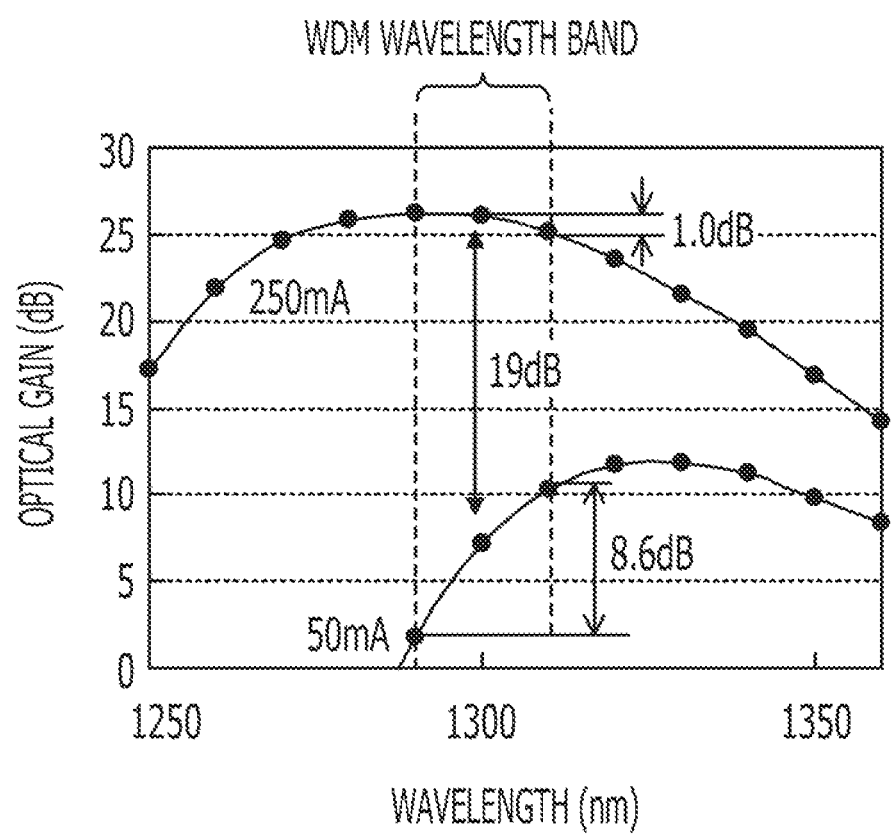
FIG. 2 is a correlation diagram between a wavelength and an optical gain in a semiconductor optical amplifier.

Such a case will be described specifically with reference to FIG. 2. FIG. 2 illustrates the relationship between an optical gain and a wavelength at a driving current of 50 mA and the relationship at a driving current of 250 mA in the SOA 321. Furthermore, the WDM has a wavelength band of 1290 to 1310 nm. At a wavelength of 1300 nm, which is the center wavelength of the WDM wavelength band, the difference between the optical gain at a driving current of 50 mA and the optical gain at a driving current of 250 mA is 19 dB. Thus, the optical gain may be changed greatly by changing the driving current.

However, gain deviation, when the wavelength band of WDM is in the wavelength range of 1290 nm to 1310 nm, is 1.0 dB when the driving current is 250 mA. In contrast, the gain deviation, when the wavelength band of WDM is in the wavelength range of 1290 nm to 1310 nm, is 8.6 dB when the driving current is 50 mA. Here, the gain deviation is defined by the difference between the maximum gain and the minimum gain. In this way, when the driving current is changed to cause a change in optical gain, the gain deviation is changed in the WDM wavelength band, so that a large gain deviation may occur at a certain level of the driving current. Thus, the optical gain will vary greatly at different wavelengths in the WDM wavelength band. Therefore, it may lead to an extremely high or low light intensity of light emitted from the SOA 321. In such a case, an optical signal may not be detected correctly because the optical signal exceeds a dynamic range of the optical detector 323, causing a difficulty in demodulation of the optical signal.

Figure 3A:
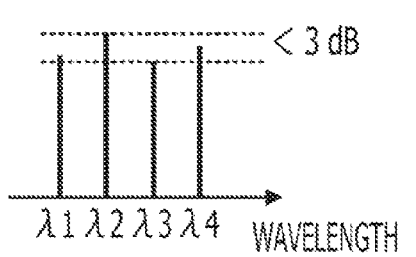
FIGS. 3A to 3C are explanatory diagrams of wavelength dependence of an optical gain in the semiconductor optical amplifier.
Figure 3B:
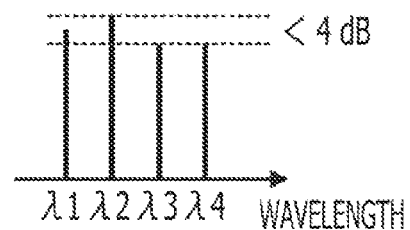
Figure 3C:
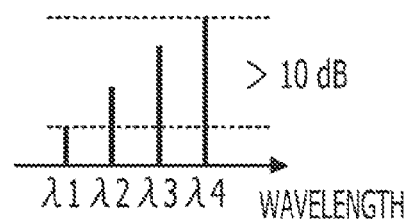

Such a case will be described more specifically with reference to FIGS. 3A to 3C. For example, as illustrated in FIG. 3A, it may be considered that the optical signal in the WDM wavelength band to be input into the SOA 321 has wavelengths of $\lambda 1$, $\lambda 2$, $\lambda 3$, and $\lambda 4$. In this case, as long as the optical gain of SOA 321 has a wavelength dependence even if the signal intensities of optical signals at wavelengths of $\lambda 1$, $\lambda 2$, $\lambda 3$, and $\lambda 4$ are 3 dB or less when input into the SOA 321, the intensities of optical signals of $\lambda 1$, $\lambda 2$, $\lambda 3$, and $\lambda 4$ output from the SOA 321 may be significantly different from one another. For example, as illustrated in FIG. 3B, when the driving current of the SOA 321 is 250 mA after amplification with the SOA 321, the intensity differences among the optical signals of $\lambda 1$, $\lambda 2$, $\lambda 3$, and $\lambda 4$ are about 4 dB or less. In contrast, as illustrated in FIG. 3C, when the driving current of the SOA 321 is 50 mA after amplification with the SOA 321, the intensity differences among the optical signals of $\lambda 1$, $\lambda 2$, $\lambda 3$, and $\lambda 4$ exceed 10 dB. In the case that the intensity differences of optical signals exceed 10 dB as described above, the light intensities of optical signals which are incident on the optical detector 323 exceed a dynamic range in the optical detector 323. As a result, these optical signals may not be converted or demodulated correctly.

Thus, an increase in intensity difference in optical signals in the wavelength band when the optical signals are amplified may be caused by, for example, a significant change in gain deviation in the wavelength band of WDM when a driving current is changed to change optical gain in the SOA 321.

Therefore, the SOA 321 that amplifies a WDM signal is may be one having a small gain deviation in the WDM wavelength band, or a semiconductor optical amplifier or optical amplification apparatus with low wavelength dependence in the WDM wavelength band.

The change in wavelength dependence of gain in response to a change in SOA driving current has been described above. Actually, the polarization dependence of gain is also changed depending on the SOA driving current, and the polarization state of a signal beam is random. Depending on the polarization state of the signal beam, the deviation of the output level of the SOA may be increased. Therefore, a semiconductor optical amplifier and optical amplification apparatus with low polarization dependence are desired.

First Embodiment

A semiconductor optical amplifier of a first embodiment will be described.

(Configuration of Semiconductor Optical Amplifier)

First, the configuration of a semiconductor optical amplifier will be described with reference to FIGS. 4A to 4C. Here, FIG. 4A is a cross-sectional view of a plane along the traveling direction of light in the semiconductor optical amplifier of the present embodiment, FIG. 4B is a cross-sectional view obtained by cutting along line 4A-4B in FIG. 4A, and FIG. 4C is a cross-sectional view along line 4C-4D in FIG. 4A.

In the semiconductor optical amplifier of the present invention, an n-InP cladding layer 12 is formed on an n-InP substrate 11 and serves as a lower cladding layer. An optical amplification layer 13 is formed in the optical amplification region 31 on this n-InP cladding layer 12, and a light absorption layer 14 is formed in the light absorption region 32. Furthermore, a p-InP cladding layer 15, which serves as an upper cladding layer, and a contact layer 16, which is made of a p-GaInAs layer, are formed on the optical amplification layer 13 and on the light absorption layer 14. A SOA electrode 17, which serves as an optical amplification layer electrode, is formed on the p-InP cladding layer 15 through the contact layer 16 in the optical amplification layer 31. A light absorption layer electrode 18 is formed in the light absorption region 32 and a common electrode 19 is formed on the bottom surface of the n-InP substrate 11. Furthermore, the SOA electrode 17 and the light absorption layer electrode 18 are anode electrodes, while the common electrode 19 is a cathode electrode.

In the semiconductor optical amplifier of the present embodiment, the optical amplification region 31 is formed with a length of about 1000 μm, the light absorption region 32 is formed with a length of about 350 μm, and the length of the whole is about 1350 μm. In addition, a high-resistance Semi-Insulating (SI)-InP current constriction layer 20 is formed on the lateral sides of each of the optical amplification layer 13 and the light absorption layer 14. Furthermore, an anti-reflection film 21 is formed on the side of the light absorption region 32 where a signal beam enters, while an anti-reflection film 22 is formed on the side of the optical amplification region 31 where the signal beam exits.

Here, the optical amplification layer 13 is an i-InGaAsP strained Multiple Quantum Well (MQW) optical amplification layer. The optical amplification layer 13 is constructed of a combination of i-InGaAsP well layers and i-InGaAsP barrier layers (not illustrated). The composition ratios of i-InGaAsP well layers and i-InGaAsP barrier layers are adjusted, so that the optical amplification layer 13 has a band gap of about 0.8 eV. In addition, the light absorption layer 14 is made of i-InGaAsP with a composition ratio adjusted to have a band-gap wavelength of about 1.31 μm. The light absorption layer 14 has a band gap of about 0.947 eV. Furthermore, the light absorption layer 14 is provided with tensile strain and the amount of strain is −0.42%. Furthermore, the light absorption layer 14 is made of a material where the band gap thereof is larger than that of the optical amplification layer 13 but smaller than the band gaps of the n-InP substrate 11, n-InP cladding layer 12, and p-InP cladding layer 15. In the semiconductor optical amplifier of the present embodiment, free carriers may be efficiently accumulated in the light absorption layer 14 by applying a bias current through an anode electrode and a cathode electrode in the forward direction.

FIG. 5 illustrates the optical gain/absorption spectrum of each of the optical amplification layer 13 and the light absorption layer 14. Specifically, FIG. 5 illustrates the optical gain/absorption spectrum of the optical amplification layer 13 in a state where free carriers are accumulated by current injection as well as optical gain/absorption spectrum of the light absorption layer 14 in a state where free carriers are accumulated by current injection. The light absorption layer 14 generates an optical gain at around 1.31 μm, which is the band-gap wavelength of the light absorption layer 14. On the other hand, in the wavelength region longer than 1.50 μm, the light absorption layer 14 has a flat absorption spectrum due to a free-carrier absorption effect. Therefore, the light in this wavelength region will be absorbed in the light absorption layer 14. Furthermore, the difference between the band gaps corresponding to the difference between the light at a wavelength of about 1.50 μm or more and the light at a wavelength of about 1.31 μm is about 0.12 eV. On the other hand, the optical amplification layer 13 generates an optical gain at a wavelength of about 1.55 μm, which is the band-gap wavelength of the optical amplification layer 13. Therefore, the semiconductor optical amplifier of the present embodiment amplifies light at a wavelength of 1.55 μm in the optical amplification layer 13 and absorbs the light in the light absorption layer 14.

Figure 6:
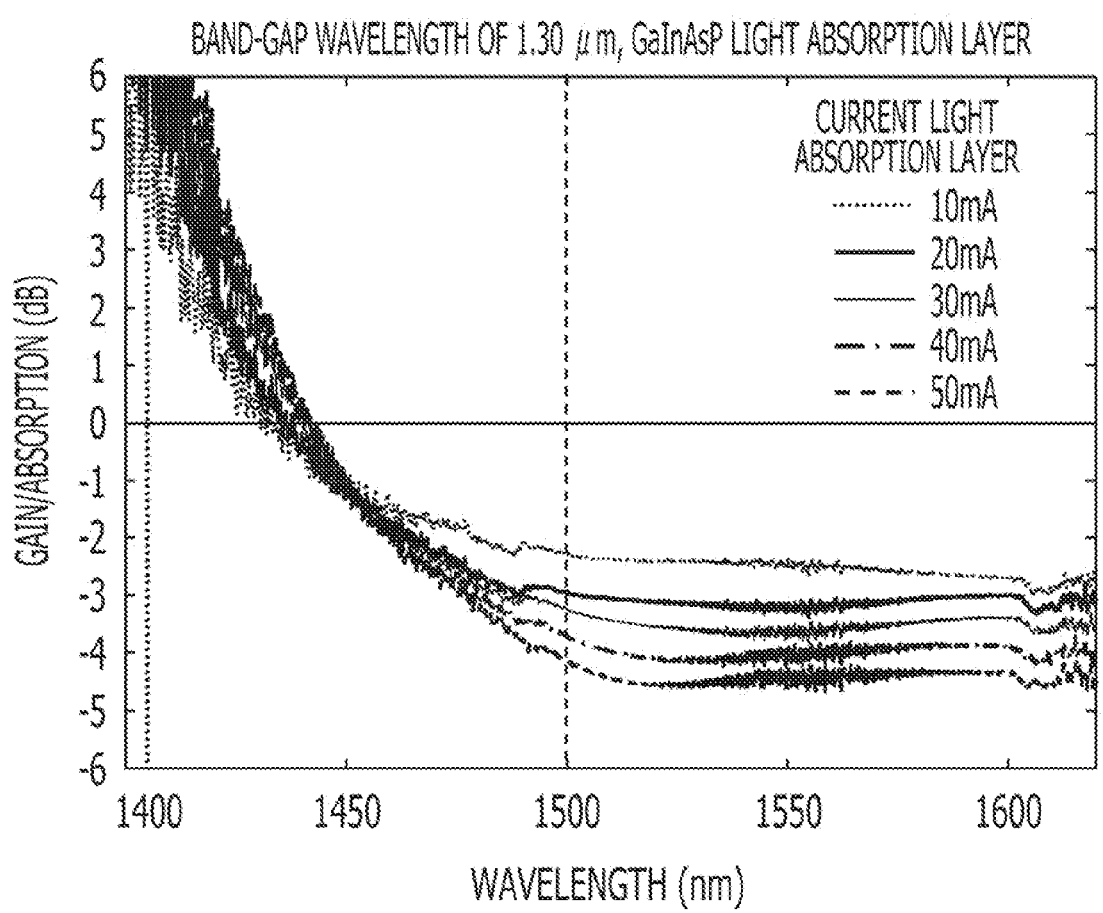
FIG. 6 is a diagram illustrating optical gain/absorption spectra in a light absorption layer.

Next, the current injection characteristics of the light absorption layer 14 will be described with reference to FIG. 6. For example, FIG. 6 illustrates the injection current dependence of the absorption spectrum in the GaInAsP absorption layer (band gap: 0.954 eV, length: 350 μm) of a band gap wavelength of 1.30 μm formed on the InP substrate. In FIG. 6, the vertical axis represents the gain/absorption amount of light. Positive values represent gains and negative values represent absorption. As illustrated in FIG. 6, in the wavelength region of about 1.5 μm or longer, the amount of light absorbed with the free-carrier absorption effect is substantially constant without depending on the wavelength. In addition, the amount of light absorbed in absorption layer 14 tends to increase corresponding to the amount of current to be injected.

In the semiconductor optical amplifier of the present embodiment, the light absorption layer 14 may be capable of uniformly absorbing light in a wavelength band to be used as signal light without depending on the wavelength. Thus, since light at a wavelength of 1.5 μm is light that has corresponding light energy of 0.827 eV, the band gap of the light absorption layer 14 may be at least 0.12 eV higher than the energy of signal light. In other words, if the light has a wavelength corresponding to energy which is at least 0.12 eV lower than the band gap of the material used in the light absorption layer 14, the light will be uniformly absorbed over a wavelength band of several tens of nanometers where WDM signals are located, without depending on the wavelength of the light. Furthermore, the optical amplification layer 13 provides an optical gain over a wavelength regime of tens of nanometers around its bandgap energy. Therefore, the bandgap energy of the optical amplification layer 13 has to be smaller than that of the light absorption layer by at least 0.12 eV.

Thus, in the light absorption layer 14, it is possible to accumulate free carriers (electrons and holes) by current injection and change the density of the free carriers by adjusting the amount of current injected. In general, the generation of high-density free carriers in a semiconductor layer leads to the generation of an optical absorption effect over a wide wavelength region due to carrier plasma effect or inter-valence band absorption. The optical absorption effect has a substantially uniform absorption spectrum over a wide wavelength region which have a certain lower light energy than the band gap energy of the semiconductor layer. Therefore, in a wavelength band used for WDM signal light, light may be absorbed almost uniformly without depending on the wavelength. It is possible to control the amount of light absorption by adjusting the amount of current injected into the light absorption layer 14.

Next, the polarization dependence of optical absorption caused in the light absorption layer 14 of the semiconductor optical amplifier of the present embodiment will be described. The optical confinement factors of the light absorption layer 14 for the TE and TM waveguide modes are defined as $\Gamma_{TE}$ and $\Gamma_{TM}$. In addition, the material light absorption coefficients generated by current injection into the light absorption layer 14 are defined as $\alpha_{TE}$ and $\alpha_{TM}$. Then, the following equation (1) may be satisfied.

$$\Gamma_{TE} \times \alpha_{TE} = \Gamma_{TM} \times \alpha_{TM} \tag{1}$$

The material light absorption coefficient due to free-carrier absorption represented in an unstrained bulk light absorption layer does not have polarization dependence, and $\alpha_{TE}$ is equal to $\alpha_{TM}$ ($\alpha_{TE} = \alpha_{TM}$). Thus, when using the strain-free bulk light absorption layer, it is required to employ a square cross-sectional waveguide structure which provides a symmetric optical confinement ($\Gamma_{TE} = \Gamma_{TM}$). However, such structure is problematic in the semiconductor optical amplifier from a viewpoint of the manufacturing tolerance and of the consistency with the optical amplification layer 13. Therefore, in the semiconductor layer or SOA, the above equation (1) may be satisfied by a process of inducing the anisotropy of a band structure in the light absorption layer 14 by applicating the strain to adjust the polarization dependence of optical absorption coefficient to make $\alpha_{TE} < \alpha_{TM}$. This procedure provides both the larger manufacturing tolerance and the better consistency with the optical amplification layer 13, while having high design flexibility. Thus, a SOA having desired characteristics may be obtained. Therefore, in the semiconductor optical amplifier of the present embodiment, the light absorption layer 14 without polarization dependence may be obtained by providing the light absorption layer 14 with strain.

Figure 7:
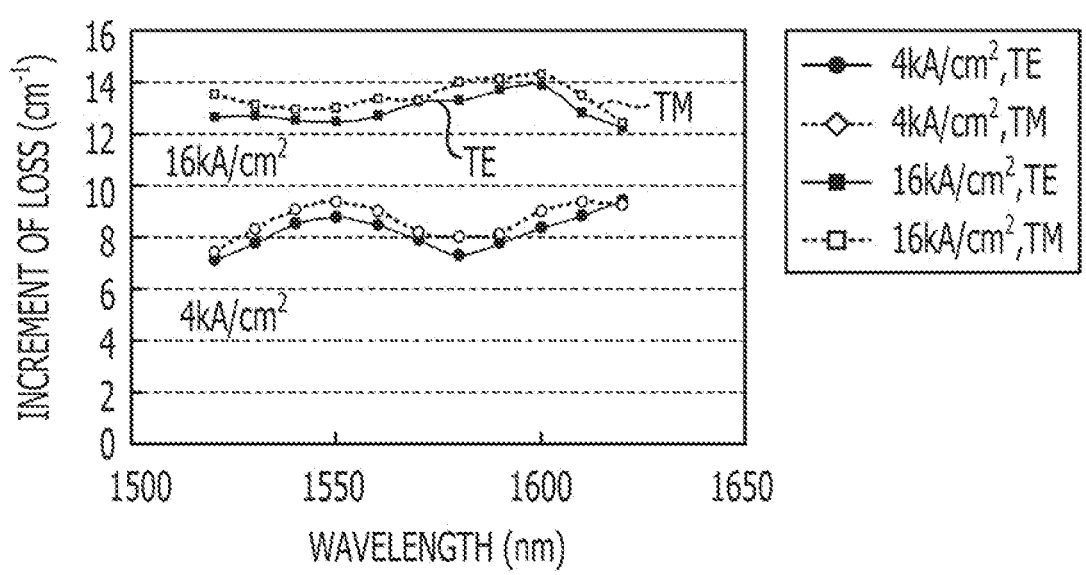
FIGS. 7 to 9 are diagrams illustrating an optical absorption spectrum in a strained light absorption layer.
Figure 8:
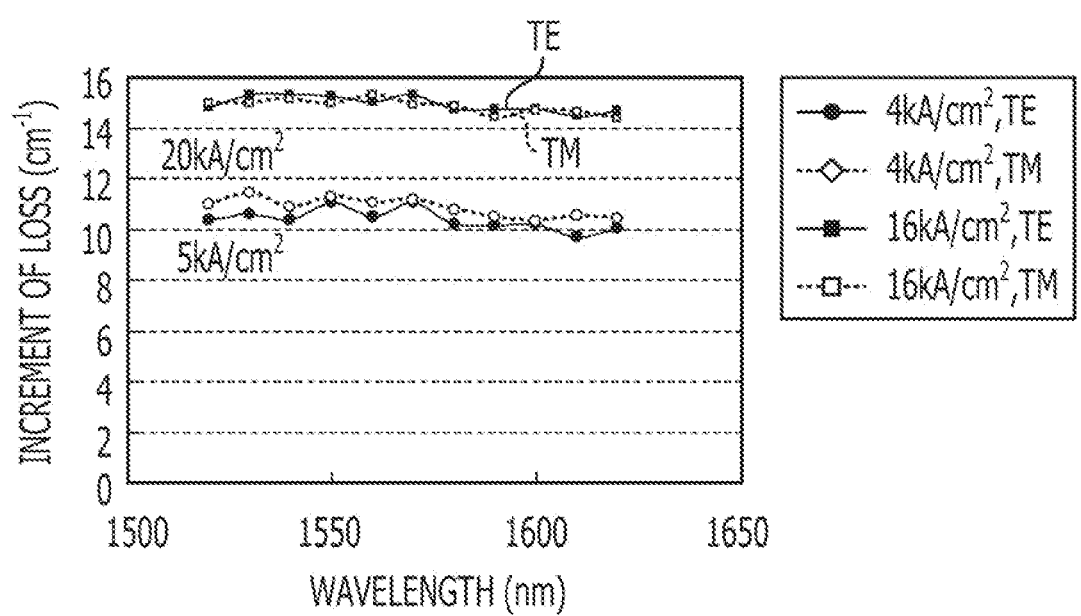
Figure 9:
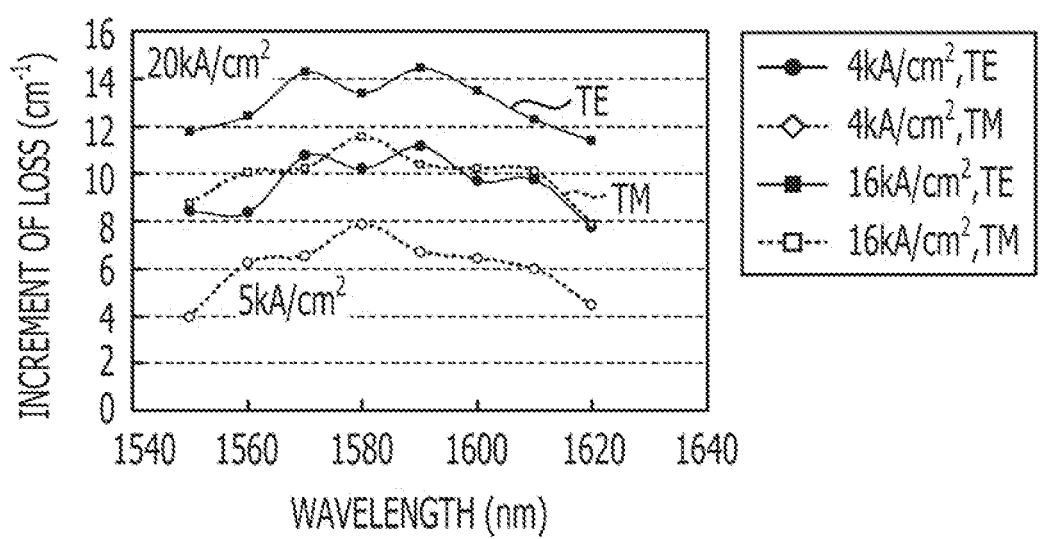

Next, the polarization independence of the light absorption layer 14 in the semiconductor optical amplifier of the present embodiment will be described. FIGS. 7 to 9 illustrate loss increase characteristics of the light absorption layer 14 provided with material strain. Specifically, in FIGS. 7 to 9, an increase in optical loss caused by current injection was normalize to the increase in waveguide loss coefficient α (cm$^{-1}$) comparing to that of un-injected absorption layer. The relationship between the amount of loss change that actually occurred, ΔG, and the amount of change in waveguide loss coefficient Δα, is represented by the following equation (2) when the length of the resulting device is defined as "L".

$$\Delta G = \exp(\Delta \alpha \times L) \quad (2)$$

In addition, the light absorption layer 14 is made of a material having a band-gap wavelength of 1.30 to 1.31 μm. Here, FIG. 7 illustrates a case where the amount of tensile strain applied to the light absorption layer 14 is −0.76%, FIG. 8 illustrates a case where the amount of tensile strain applied to the light absorption layer 14 is −0.42%, and FIG. 9 illustrates the amount of compressive strain applied to the light absorption layer 14 is +1.0%. Furthermore, the amount of strain represented by a negative number indicates tensile strain and the amount of strain represented by a positive number indicates compressive strain.

When the amount of strain illustrated in FIG. 7 is −0.76%, the increment of the loss of TM polarization is about 0.5 cm$^{-1}$ in total higher than that of TE polarization. Thus, the amount of loss in TM polarization is different from the amount of loss in TE polarization. Furthermore, when the amount of strain illustrated in FIG. 8 is −0.42%, there is very little difference between the increment of the loss in TE polarization and the increment of the loss in TM polarization. Thus, the light absorption layer 13 may have polarization insensitivity. When the amount of strain illustrated in FIG. 9 is +1.0%, the increment of the loss of TE polarization is 2 to 3 cm$^{-1}$ in total higher than that of TM polarization. Thus, the amount of loss in TE polarization is different from the amount of loss in TM polarization.

Figure 10:
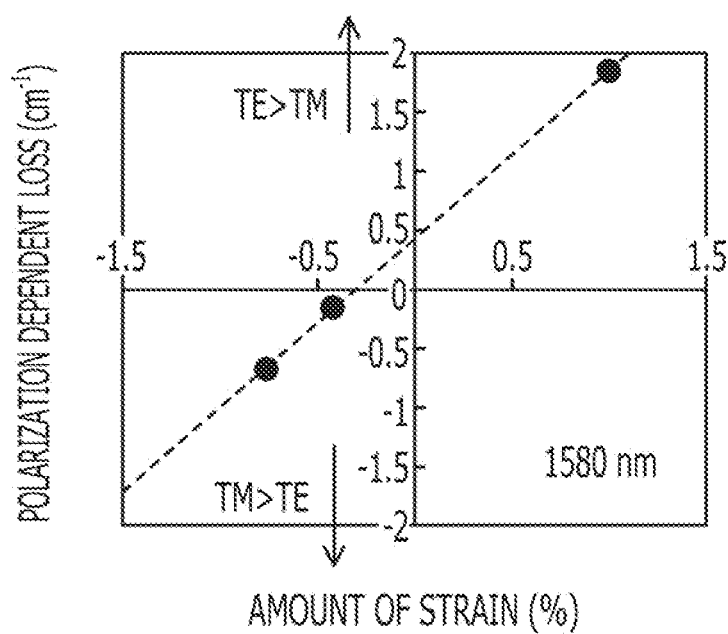
FIG. 10 is a correlation diagram between the amount of strain and a polarization dependent loss in a light absorption layer.

The relationship between the amount of strain and the polarization dependent loss of the light absorption layer 14, which is based on these results, is illustrated in FIG. 10. Here, the value of a polarization dependent loss is based on a value when the wavelength is 1580 nm. As illustrated in FIG. 10, the strain and the polarization dependent loss are linearly correlated with each other. Therefore, the value of the polarization dependent loss may be adjusted by adjusting the amount of strain of the light absorption layer 14. A lower polarization dependent loss may be achieved. Therefore, the amount of strain h of the light absorption layer 14 may be in the range of −0.67%≤h≤0%, and more specifically in the range of −0.42%≤h≤0%.

Figure 11:
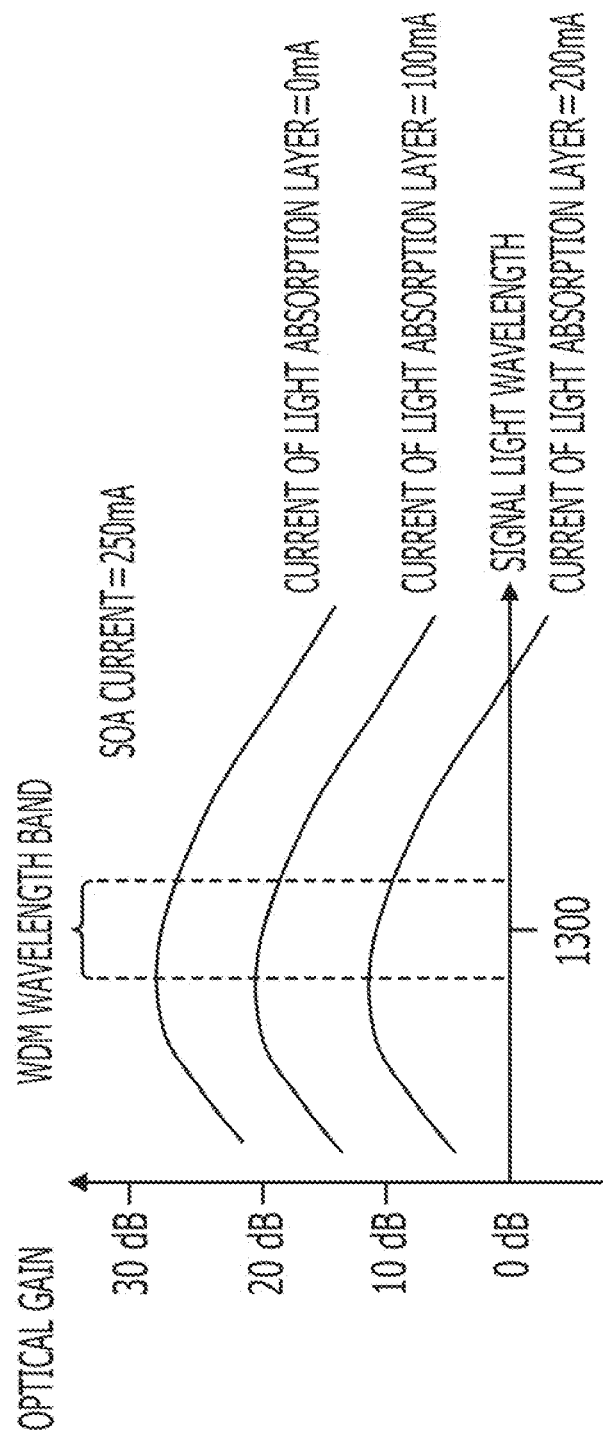
FIG. 11 is a correlation diagram between a wavelength and an optical gain of the semiconductor optical amplifier according to the first embodiment.

Next, the optical gain spectrum of the semiconductor optical amplifier of the present embodiment will be described. FIG. 11 illustrates the relationship between the wavelength and the optical gain when the driving current of the optical amplification layer 13 is set to 250 mA and the driving current of the light absorption layer 14 is changed. As illustrated in FIG. 11, the optical gain in the WDM wavelength band decreases without depending on the wavelength when the driving current of the light absorption layer 14 is increased from 0 mA, to 100 mA and 200 mA. That is, in the semiconductor optical amplifier of the present embodiment, a desired optical gain may be obtained without depending on the wavelength by setting the driving current of the optical amplification layer 13 to a constant value and controlling the driving current of the light absorption layer 14.

Figure 12A:
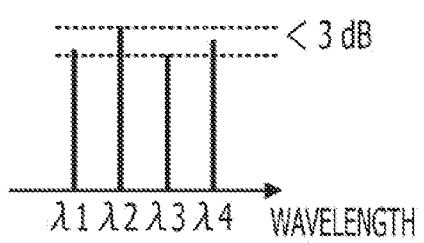
FIGS. 12A to 12C are explanatory diagrams illustrating the wavelength dependence of optical gain of the semiconductor optical amplifier according to the first embodiment.
Figure 12B:
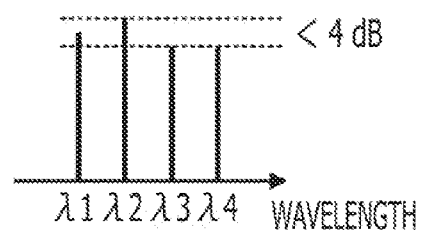
Figure 12C:
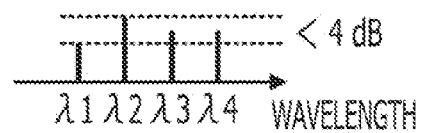

This case will be described in more detail with reference to FIGS. 12A to 12C. For example, as illustrated in FIG. 12A, optical signals of wavelengths λ1, λ2, λ3, and λ4 will be considered as optical signals in the WDM wavelength band to be input to the semiconductor optical amplifier of the present invention. In this case, even if an amplification factor given by the semiconductor optical amplifier of the embodiment is changed, the intensity differences among the optical signals of λ1, λ2, λ3, and λ4 fall into a mostly fixed range. In other words, the intensity differences among the optical signals of λ1, λ2, λ3, and λ4 fall into a mostly fixed range without depending on the optical gain of the semiconductor optical amplifier. For example, as illustrated in FIG. 12B, if the driving current of the light absorption layer 14 is 0 mA, the intensity differences among the optical signals of λ1, λ2, λ3, and λ4 after being amplified by the semiconductor optical amplifier become about 4 dB or less. As illustrated in FIG. 12C, if the driving current of the light absorption layer 14 is 200 mA, the intensity differences among the optical signals of λ1, λ2, λ3, and λ4 after being amplified by the semiconductor optical amplifier become about 4 dB or less. Therefore, in the semiconductor optical amplifier of the present embodiment, the optical gain of each optical signal may be collectively adjusted without depending on a wavelength by controlling the driving current of the light absorption layer 14. Thus, the intensity differences among the optical signals emitted from the semiconductor optical amplifier fall into a fixed range. Therefore, the light intensities of the amplified optical signals do not exceed the dynamic range of an optical detector so that the optical signals will be converted into electric signals and demodulated correctly.

Furthermore, in the semiconductor optical amplification apparatus of the present embodiment, an optical gain control speed is determined by the lifetime of carriers in the light absorption layer 14, and the lifetime of carriers is in the order of nanoseconds. Thus, the optical gain may be controlled at an extremely high speed.

(Method for Manufacturing Semiconductor Optical Amplifier)

Next, a method for manufacturing a semiconductor optical amplifier of the present embodiment will be described.

Figure 13:
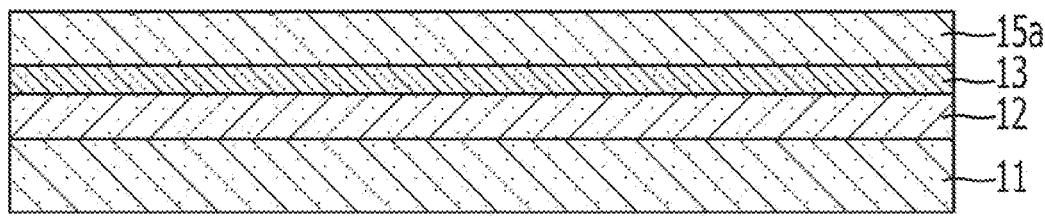
FIGS. 13 to 23 are manufacturing process diagrams of the semiconductor optical amplifier according to the first embodiment.

First, as illustrated in FIG. 13, an n-InP cladding layer 12, optical amplification layer 13, and p-InP cladding layer 15a are epitaxially grown and formed on an n-InP substrate 11 by a Metal Organic Chemical Vapor Deposition (MOCVD) method. In this case, the n-InP cladding layer 12 formed has a film thickness of 500 nm, the optical amplification layer 13 has a film thickness of 100 nm and the p-InP cladding layer 15a has a film thickness of 100 nm. Furthermore, the optical amplification layer 13 is an i-GaInAsP strained MQW optical amplifier and is formed by adjusting the composition thereof to have a light emission wavelength of 1.55 μm.

Figure 14:
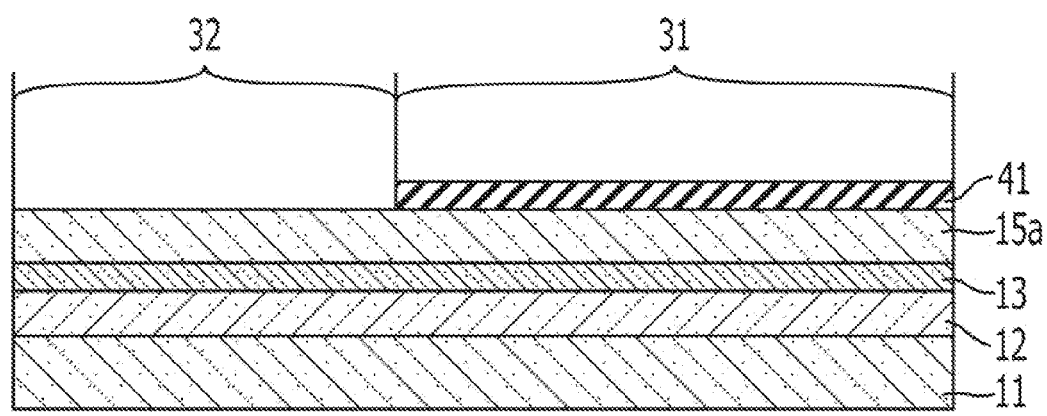

Next, as illustrated in FIG. 14, a SiO$_2$ mask 41 is formed on an area where an optical amplification region 31 is formed on the p-InP cladding layer 15a. Specifically, a SiO$_2$ film is formed on the p-InP cladding layer 15a. Then, a photoresist is applied to the resulting SiO$_2$ film, exposed with an exposure device, and developed to form a resist pattern on the SiO$_2$ film on the area where the optical amplification region 31 is formed. Subsequently, the resist pattern is used as a mask to remove the SiO$_2$ film by Reactive Ion Etching (RIE) from an area where the resist pattern is not formed. After that, the resist pattern is removed. Consequently, a SiO$_2$ mask 41 is formed on the area where the optical amplification region 31 is formed on the p-InP cladding layer 15a. Therefore, the SiO$_2$ mask 41 is not formed on an area where a light absorption layer 32 is formed on the p-InP cladding layer 15a.

Figure 15:
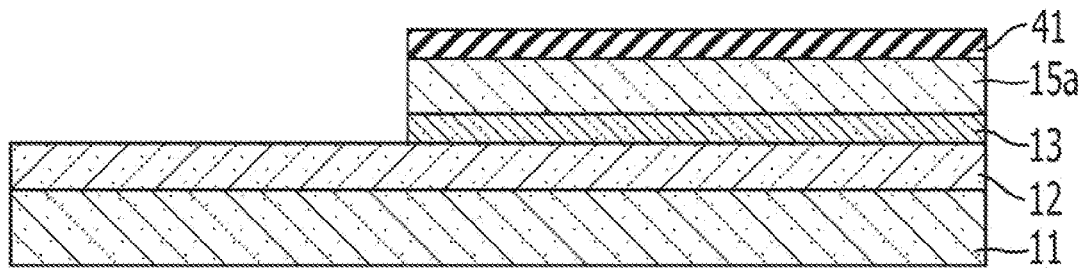

As illustrated in FIG. 15, the p-InP cladding layer 15a and the optical amplification layer 13 are removed by wet-etching from the area where the SiO$_2$ mask 41 is not formed, or the area where the light absorption region 32 is formed.

Figure 16:
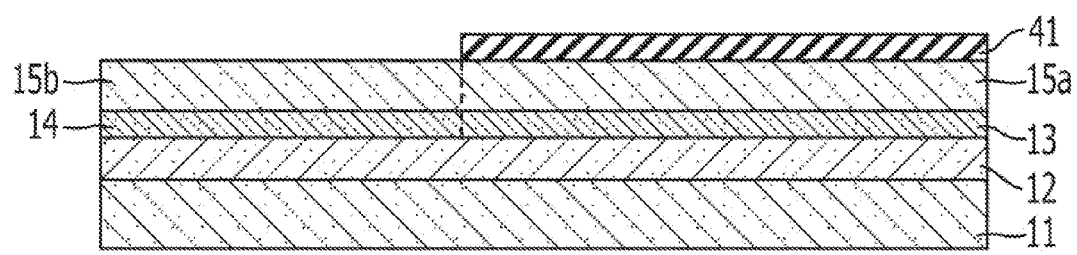

Subsequently, as illustrated in FIG. 16, a light absorption layer 14 and a p-InP cladding layer 15b are formed on the n-InP cladding layer 12, which corresponds to an area where the SiO$_2$ mask 41 is not formed, or where the light absorption region 32 is formed. Furthermore, both the light absorption layer 14 and the p-InP cladding layer 15b are formed by MOCVD epitaxial growth. Such a formation method is also called a butt-joint growth method. In this case the resulting light absorption layer 14 is an i-GaInAsP strained light absorption layer with a composition wavelength of 1.31 μm, a strain of −0.42%, and a film thickness of 100 nm. Furthermore, the p-InP cladding layer 15b has a film thickness of 100 nm. Therefore, the light absorption layer 14 and the p-InP cladding layer 15b are formed on the area where the SiO$_2$ mask 41 is not formed, or on the area where the light absorption region 32 is formed.

Figure 17:
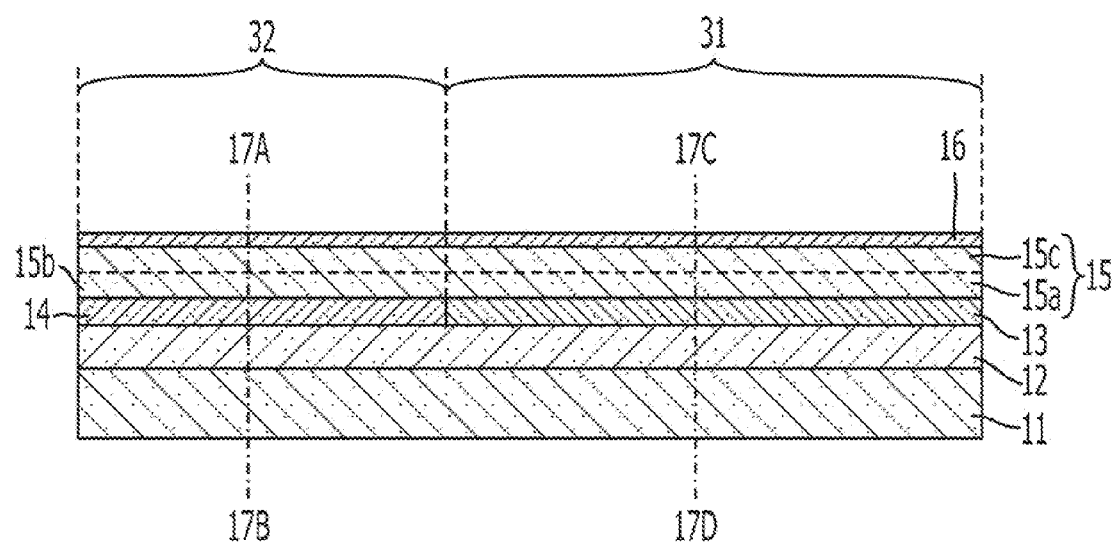
Figure 18A:
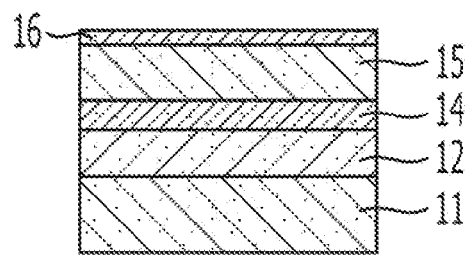
Figure 18B:
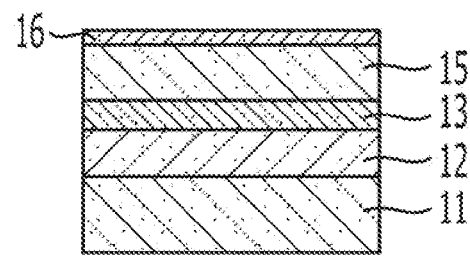

After removing the SiO$_2$ mask 41, as illustrated in FIG. 17, a p-InP cladding layer 15c is formed on the p-InP cladding layers 15a and 15b by epitaxial growth by MOCVD or the like and a contact layer 16 is then formed thereon. The formed p-InP cladding layer 15c has a film thickness of 2 μm. A p-InP cladding layer 15 is constructed of the p-InP cladding layers 15a, 15b, and 15c. The contact layer 16 is a p-GaInAs layer with a film thickness of 500 μm. Furthermore, a cross-sectional view along line 17A-17B in FIG. 17 is illustrated in FIG. 18A and cross-sectional view along line 17C-17D and FIG. 18B. In other words, in the step illustrated in FIG. 17, the cross sectional view of the light absorption region 32 is illustrated in FIG. 18A and the cross-sectional view of the optical amplification region 31 is illustrated in FIG. 18.

Figure 19A:
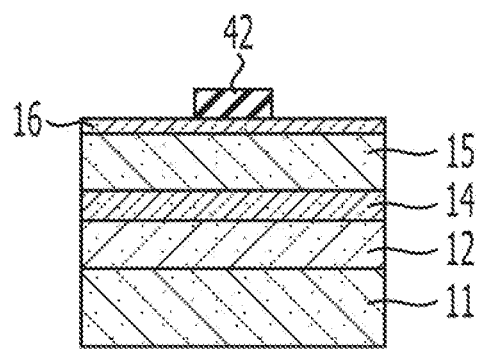
Figure 19B:
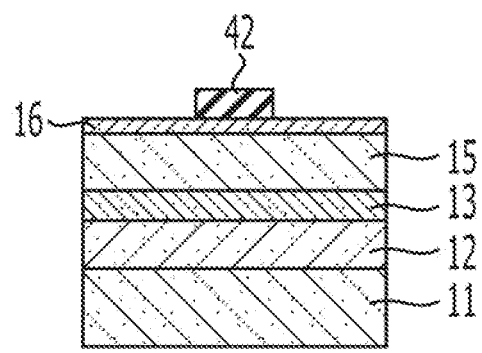

Subsequently, as illustrated in FIGS. 19A and 19B, a SiO$_2$ mask 42 is formed. Specifically, a SiO$_2$ film is formed on the contact layer 16. Then, a photoresist is applied to the resulting SiO$_2$ film, followed by being exposed by an exposure device and developed to form a resist pattern on the SiO$_2$ film on a predetermined area where a mesa which will be mentioned later is formed. After that, Reactive Ion Etching (RIE) is performed using the resist pattern as a mask to remove the SiO$_2$ film from an area where the resist pattern is not formed. Then, the resist pattern is removed, thereby forming a SiO$_2$ mask 42 on a predetermined area on the contact layer 16. Furthermore, FIG. 19A is a cross-sectional view of the light absorption region 32 and FIG. 19B is a cross-sectional view of the optical amplification region 31.

Figure 20A:
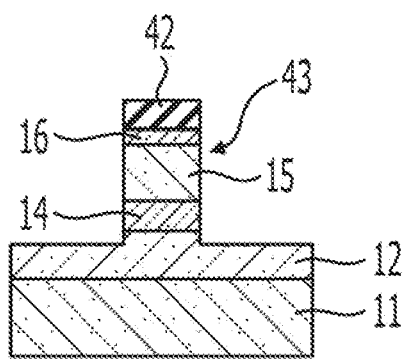
Figure 20B:
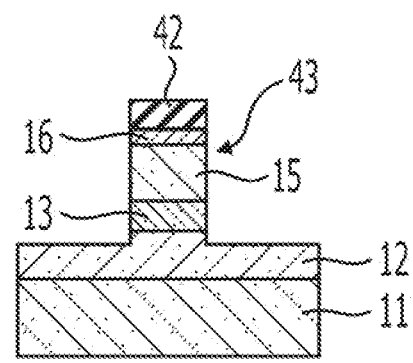

As illustrated in FIGS. 20A and 20B, the contact layer 16, the p-InP cladding layer 15, the i-GaInAsP strained MQW optical amplification layer 13 or the light absorption layer 14, and the n-InP cladding layer 12 are partially removed by RIE from an area where the SiO$_2$ mask 42 is not formed. As a result, a mesa 43 is formed on an area where the SiO$_2$ mask 42 is formed. The optical amplification layer 13 and the light absorption layer 14, where the mesa 43 is formed, form a waveguide in the semiconductor amplifier of the present embodiment. Furthermore, FIG. 20A is a cross-sectional view of the light absorption region 32 and FIG. 20B is a cross-sectional view of the optical amplification region 31.

Figure 21A:
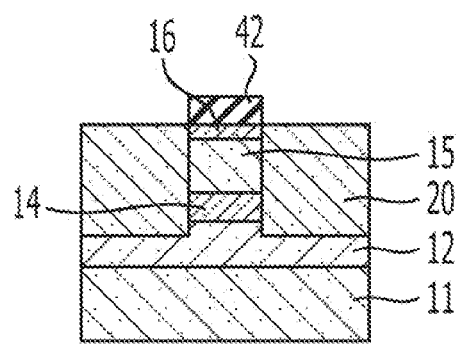
Figure 21B:
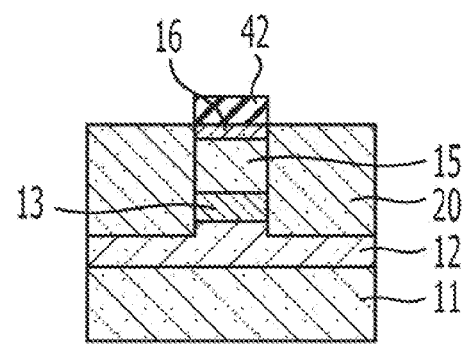

Subsequently, as illustrated in FIGS. 21A and 21B, an insulating SI-InP current constriction layer 20 is formed on the both sides of the mesa 43 by MOCVD epitaxial growth. The SI-InP current constriction layer 20 is formed so as to be the same height as the surface of the contact layer 16. FIG. 21A is a cross-sectional view of the light absorption region 32 and FIG. 21B is a cross-sectional view of the optical amplification region 31.

Figure 22A:
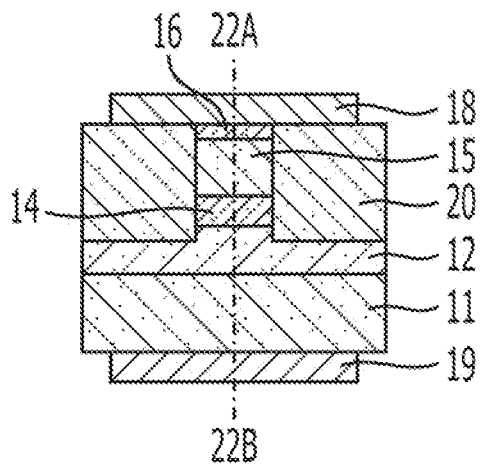
Figure 22B:
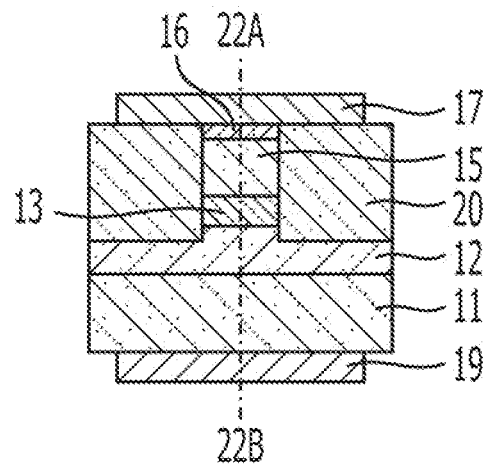

Next, as illustrated in FIGS. 22A and 22B, the SiO$_2$ mask 42 is removed. A SOA electrode 17 is formed on the contact layer 16 in the optical amplification region 31, a light absorption layer electrode 18 is formed on the contact layer 16 in the light absorption region 32, and a common electrode 19 is formed in the bottom surface of the n-InP substrate 11. Furthermore, FIG. 22A is a cross-sectional view of the light absorption region 32 and FIG. 22B is a cross-sectional view of the optical amplification region 31.

Figure 23:
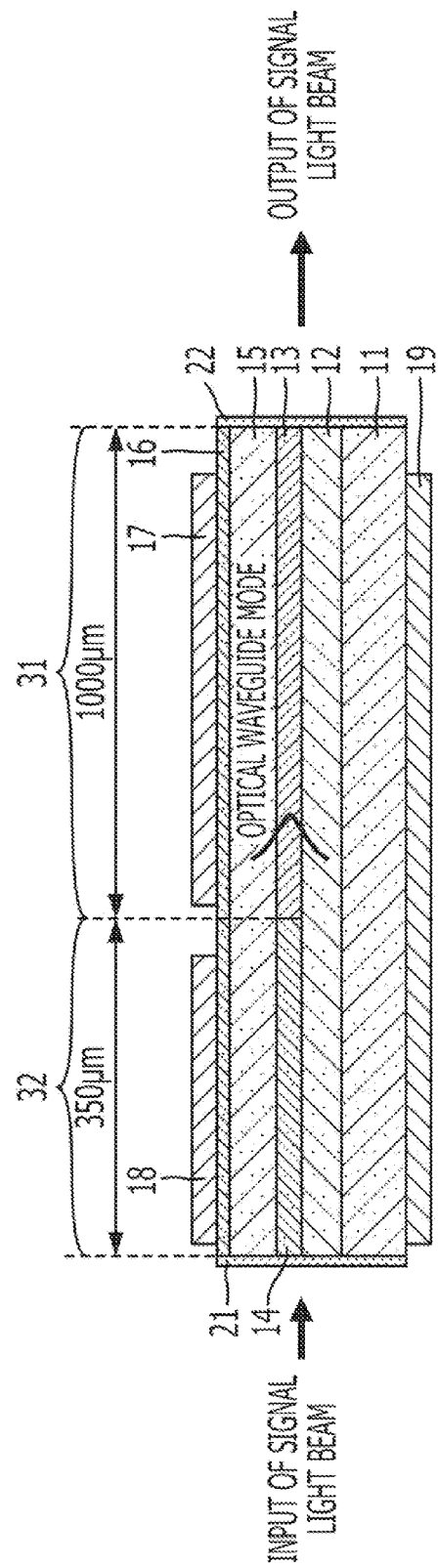

After separating the chips, as illustrated in FIG. 23, an anti-reflection film 21 is formed on the end face on the side of the light absorption region 31 which is the surface on which a signal light beam is incident. An anti-reflection film 22 is formed on the end face on the side of the optical amplification region 32 which is the surface from which the signal light beam is emitted. The anti-reflection films 21 and 22 are formed of dielectric multilayer films, each having a reflectance of 0.1% or less with respect to the wavelength of the signal light beam. Furthermore, FIG. 23 is a process diagram illustrating a cross section along line 22A-22B in FIGS. 22A and 22B, or a process diagram illustrating the same cross section as the one illustrated in FIGS. 13 to 17.

In the semiconductor optical amplifier formed as described above, the optical amplification region 31 has a length of about 1000 μm, the light absorption region 32 has a length of about 350 μm, and the whole length is 1350 μm.

Figure 24:
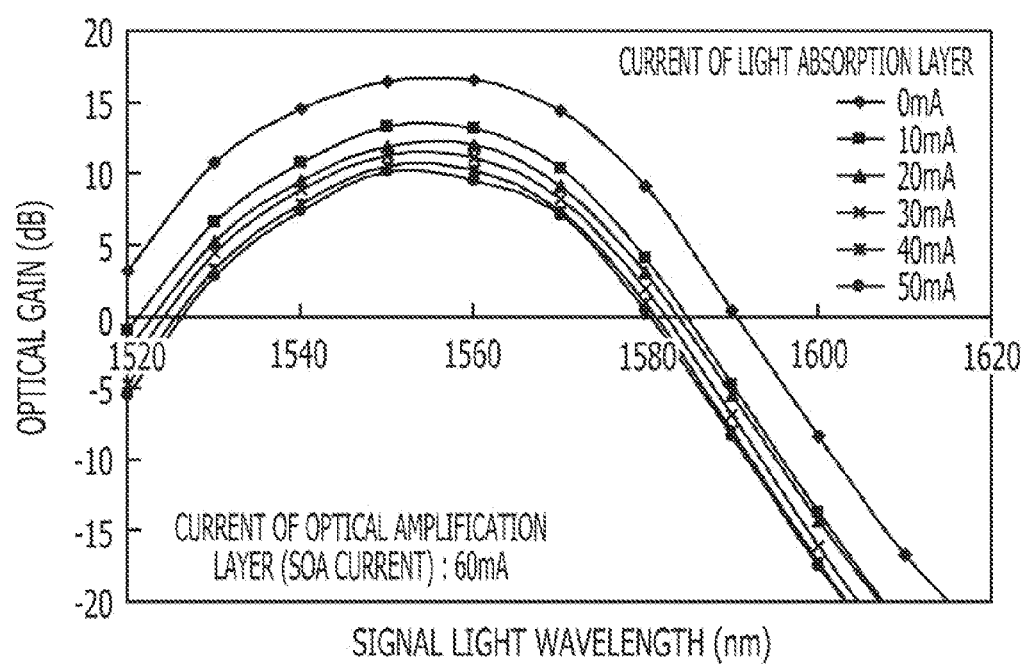
FIG. 24 is a correlation diagram between a wavelength and an optical gain of the semiconductor optical amplifier according to the first embodiment.

FIG. 24 illustrates the relationship between a wavelength and an optical gain of the semiconductor optical amplifier of the present embodiment, which is manufactured by the manufacturing method described above. Furthermore, FIG. 24 illustrates the relationship between a wavelength and an optical gain of the semiconductor optical amplifier when the current flowing through the light absorption layer 14 is changed from 0 to 50 mA while a current of 60 mA is flowing through the optical amplification layer 13. As illustrated in FIG. 24, the optical gain of the semiconductor amplifier may be changed by about 8 dB by changing the current flowing through the light absorption layer 14. Furthermore, in the semiconductor optical amplifier of the present embodiment, the profile of the optical gain versus wavelength curve is substantially identical even when the current flowing through the light absorption layer 14 is changed. Thus, the optical gain may be changed without depending on a wavelength. That is, there is almost no wavelength dependence in the change of optical gain.

Furthermore, the wavelength dependence at the time of changing the optical gain is extremely low at a wavelength in the range of 1540 nm to 1570 nm. Thus, when this wavelength region is used as a WDM wavelength band, light beams at wavelengths in the WDM wavelength band may be given almost the same optical gain without depending on a wavelength.

Therefore, in the semiconductor optical amplifier of the present embodiment, the light absorption layer 14 is formed on the side on which a signal light beam is incident and the optical amplification layer 13 is formed on the side from which a signal light beam is emitted. In the semiconductor optical amplifier of the present embodiment, the current flowing through the light absorption layer 14 may be controlled via a light absorption layer electrode 18 as well as a common electrode 19 while a constant current is flowing through the optical amplifier layer 13 via a SOA electrode 17 and the common electrode 19. Therefore, the optical gain may be changed almost uniformly without depending on a wavelength.

Furthermore, the semiconductor optical amplifier of the present embodiment is not limited to the aforementioned semiconductor optical amplifier. In addition, the composition, composition ratio, amount of strain, and film thickness, of the light absorption layer and of the optical amplification layer as well as the structure, composition, composition ratio, and arrangement of the cladding layer, the contact layer, and the current constriction layer may be arbitrarily changed as long as the effects of the semiconductor amplifier of the present invention are obtained. For example, it is possible to obtain a constant optical gain generated in the optical amplification layer without depending on polarization by application of a conventional technology for applying an appropriate crystal strain on the optical amplification layer (see, for example, Japanese Unexamined Patent Application Publication No. 4-27183). Alternatively, AlGaInAs may be used in place of GaInAsP as the material of the optical amplification layer and the light absorption layer to obtain high performance even in a high temperature environment. Specifically, an optical amplification layer is formed using AlGaInAs strained MQW in which a composition ratio thereof or the like is adjusted so that a light emission wavelength of 1.55 μm will be obtained, while a light absorption layer is formed using AlGaInAs in which a composition ratio thereof or the like is adjusted so that a band-gap wavelength of about 1.31 μm will be obtained. Furthermore, the film thickness, strain, and the like attained when using AlGaInAs are substantially similar to those attained using GaInAsP. Furthermore, as a wavelength band of light amplification by the semiconductor optical amplifier of the present embodiment, a 1.55-μm band, a 1.3-μm band, or any wavelength bands other than the 1.55-μm band and 1.3-μm band may be used by choosing the appropriate composition ratio of optical amplification layer and light absorption layer, so as to obtain optical gain and absorption at desired wavelength regime. However, in case of any wavelength bands, the difference between bandgap energies of optical amplification layer and light absorption layer must be maintained to larger than 0.12 eV.

Furthermore, the end face of the light absorption layer or the light amplification layer to serve as an optical waveguide is formed in a tilted shape with respect to the plane perpendicular to the optical waveguide. Alternatively, various tapered structures may be formed on the tip of the optical waveguide. Any of these structures may reduce the facet reflectance of the semiconductor amplifier and enhance the coupling efficiency to an optical fiber. Furthermore, the semiconductor amplifier of the present embodiment may be formed on a single substrate common to a semiconductor laser, an optical waveguide, an optical modulator, an optical detector, an optical coupler, an optical filter, or the like, allowing the production of a high-efficient optical integrated device.

Second Embodiment

Next, a second embodiment will be described. In the present embodiment, a semiconductor optical amplifier has a structure different from that of the first embodiment.

(Configuration of Semiconductor Optical Amplifier)

A semiconductor optical amplifier will be described with reference to FIGS. 25A to 25B. Here, FIG. 25A is a cross-sectional view of a plane along the traveling direction of light in the semiconductor optical amplifier of the present embodiment, and FIG. 25B is a cross-sectional view obtained by cutting along line 25A-25B in FIG. 25A.

The semiconductor optical amplifier of the present embodiment is constructed of a p-InP cladding layer 112, a light absorption layer 113, an n-InP channel layer 114, an optical amplification layer 115, a p-InP cladding layer 116, and a contact layer 117 stacked on a p-InP substrate 111. Furthermore, the p-InP cladding layer 112 may be called a lower cladding layer and the p-InP cladding layer 116 may be called an upper cladding layer. A light absorption layer electrode 118 is formed on the bottom surface of the p-InP substrate 111, meanwhile the SOA electrode 119 abuts the contact layer 117 and serves as an optical amplification layer electrode. Furthermore, a common electrode 120 is formed on the n-InP channel layer 114 and connected to the n-InP channel layer 114. Specifically, the common electrode 120 is formed on an area where a part of a second SI-InP current constriction layer 132, which will be described later, is removed. The light absorption layer 113 and the optical amplification layer 115 are formed to make an optical waveguide. A first SI-InP current constriction layer 131 is formed on both sides of the light absorption layer 113. A second SI-InP current constriction layer 132 is formed on both sides of the optical amplification layer 115. Since the optical waveguide is constructed of the light absorption layer 113 and the optical amplification layer 115, the n-InP channel layer 114 is formed to have a thickness of 300 nm or less to obtain the single mode property of the optical waveguide. Furthermore, the SOA electrode 119 and the light absorption layer electrode 118 are anode electrodes, while the common electrode 120 is a cathode electrode.

The semiconductor optical amplifier is formed with a total length of about 1000 μm. Furthermore, an anti-reflection film 141 is formed on the end face of the optical amplifier, on which a signal light beam is incident. An anti-reflection film 142 is formed on the end face of the optical amplifier, from which the signal light beam is emitted.

Here, the optical amplification layer 115 is an i-InGaAsP strained MQW optical amplification layer. The optical amplification layer 115 is formed as a combination of a well layer and a barrier layer (not illustrated), which is made of i-InGaAsP with a composition ratio thereof adjusted to make a band-gap wavelength of about 1.55 μm. The optical amplification layer 115 has a band gap of about 0.8 eV. Furthermore, the light absorption layer 113 is made of i-InGaAsP with a composition ratio thereof adjusted to make a band-gap wavelength of about 1.31 μm. The light absorption layer 113 has a band gap of about 0.947 eV.

Furthermore, the light absorption layer 113 is provided with tensile strain and the amount of strain is −0.42%. Furthermore, the light absorption layer 113 is made of a material where the band gap thereof is larger than that of the optical amplification layer 115 but smaller than the band gaps of the p-InP substrate 111 and the p-InP cladding layers 112 and 116. In the present embodiment, free carriers may be efficiently accumulated in the light absorption layer 113 by injecting a bias current through an anode electrode and a cathode electrode in the forward direction.

In the semiconductor optical amplifier of the present embodiment, the current flowing between the light absorption layer electrode 118 and the common electrode 120 may be controlled while a constant current is flowing between the SOA electrode 119 and the common electrode 120. Therefore, the optical gain of the semiconductor optical amplifier of the present embodiment may be controlled.

(Method for Manufacturing Semiconductor Optical Amplifier)

Next, a method for manufacturing a semiconductor optical amplifier of the present embodiment will be described.

Figure 26:
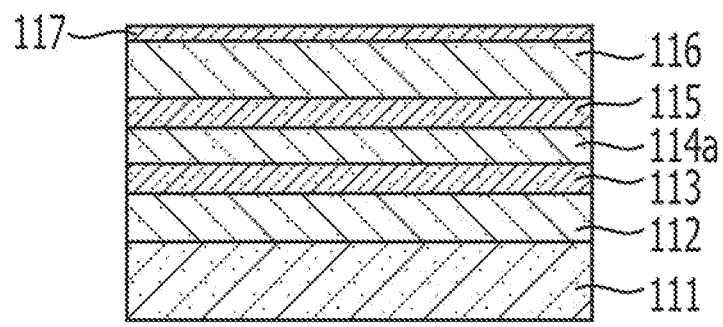
FIGS. 26 to 32 are manufacturing process diagrams of the semiconductor optical amplifier according to the second embodiment.

First, as illustrated in FIG. 26, a p-InP cladding layer 112, a light absorption layer 113, an n-InP channel layer 114a, an optical amplification layer 115, a p-InP cladding layer 116, and a contact layer 117 are formed on a p-InP substrate 111. These layers are formed, for example, by MOCVD epitaxial growth. In this case, the p-InP cladding layer 112 formed has a film thickness of 500 nm, the n-InP channel layer 114a has a film thickness of 100 nm and the p-InP cladding layer 116 has a film thickness of 2 μm. The light absorption layer 113 is an i-GaInAsP strained light absorption layer with a composition ratio or the like adjusted to make a band-gap wavelength of 1.31 μm. The light absorption layer 113 has a film thickness of 100 nm. The optical amplification layer 115 is an i-GaInAsP strained MQW optical amplification layer with a composition ratio or the like adjusted to make a band-gap wavelength of 1.55 μm. The light amplification layer 115 has a film thickness of 100 nm. Furthermore, the contact layer 117 is a p-GaInAs layer with a film thickness of 500 nm.

Figure 27:
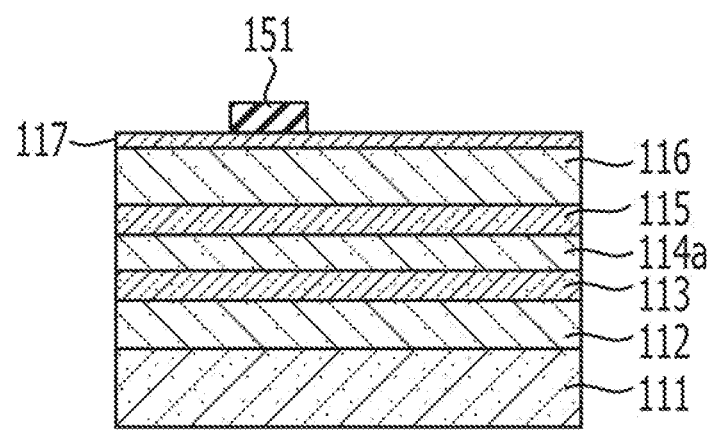

Next, as illustrated in FIG. 27, a SiO$_2$ mask 151 is formed on the contact layer 117. Specifically, a SiO$_2$ film is formed on the contact layer 117. Then, a photoresist is applied to the resulting SiO$_2$ film, then exposed by an exposure device and developed to form a resist pattern on the SiO$_2$ film on a predetermined area where a mesa which will be mentioned later is formed. After that, Reactive Ion Etching (RIE) is performed using the resist pattern as a mask to remove the SiO$_2$ film from an area where the resist pattern is not formed. Furthermore, the resist pattern is removed, thereby forming a SiO$_2$ mask 151 on a predetermined area on the contact layer 117.

Figure 28:
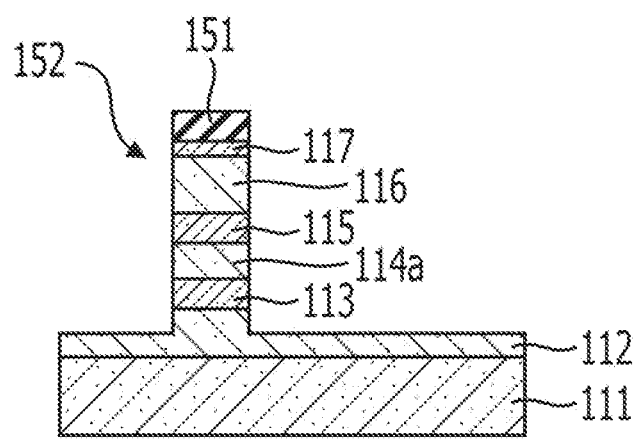

As illustrated in FIG. 28, the contact layer 117, the p-InP cladding layer 116, the optical amplification layer 115, the n-InP channel layer 114a, the light absorption layer 113, and the p-InP cladding layer 112 are partially removed from an area where the SiO$_2$ mask 151 is not formed. Specifically, the removal is performed using dry etching, such as RIE. As a result, a mesa 152 is formed on an area where the SiO$_2$ mask 151 is formed. The optical waveguide in the semiconductor optical amplifier of the present invention is constructed of the optical amplification layer 115 and the light absorption layer 113 which form the mesa 152.

Figure 29:
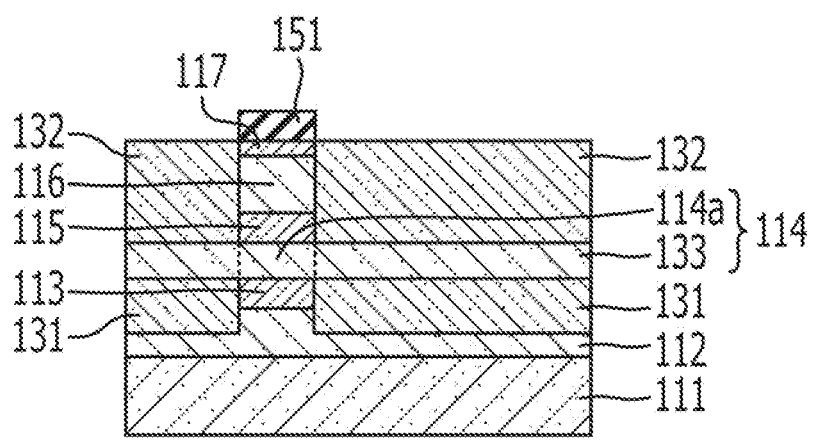

Subsequently, as illustrated in FIG. 29, an insulating first SI-InP current constriction layer 131, an n-InP channel layer 133, and an insulating second SI-InP current constriction layer 132 are formed on the both sides of the mesa 152 by MOCVD epitaxial growth. In this case, the formation is performed so that the position of the n-InP channel layer 133 will correspond to the position of the n-InP channel layer 114a. The n-InP channel layer 133 and the n-InP channel layer 114a contact each other and are located at the same height. An n-InP channel layer 114 is constructed of an n-InP channel layer 133 and the n-InP channel layer 114a. In addition, the surface of the second SI-InP current constriction layer 132 is formed so that the height thereof will be equal to the height of the surface of the contact layer 117.

Figure 30:
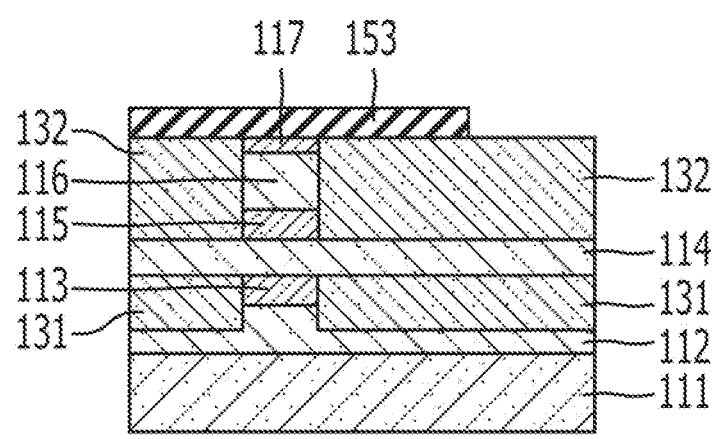

Next, as illustrated in FIG. 30, a SiO$_2$ mask 153 is formed on a predetermined area on the contact layer 117 and on the second SI-InP current constriction layer 132. Specifically, after removal of the SiO$_2$ mask 151, the SiO$_2$ film is formed on the contact layer 117 and on the second SI-InP current constriction layer 132. Subsequently, a photoresist is applied to the resulting SiO$_2$ film, then exposed by an exposure device and developed to form a resist pattern on the SiO$_2$ film on a predetermined area. Here, the "predetermined area" in this case is an area having an opening in an area where a common electrode 120, which will be described later, is formed. After that, Reactive Ion Etching (RIE) is performed using the resist pattern as a mask to remove the SiO$_2$ film from an area where the resist pattern is not formed. Furthermore, the resist pattern is removed, thereby forming a SiO$_2$ mask 153 on a predetermined area on each of the contact layer 117 and the SI-InP current constriction layer 132.

Figure 31:
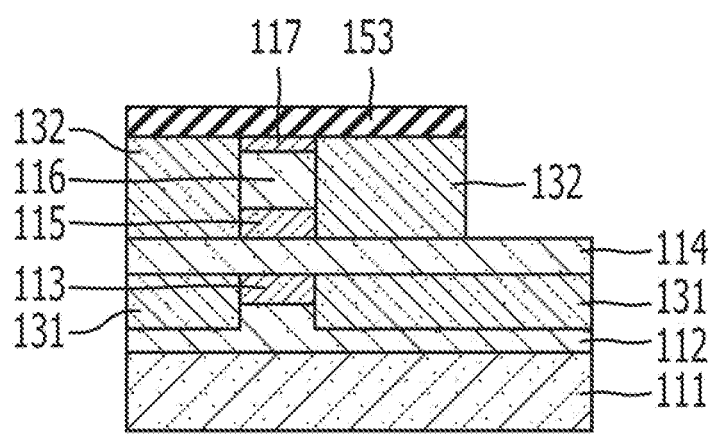

Next, as illustrated in FIG. 31, the second SI-InP current constriction layer 132 is removed from an area where the SiO$_2$ mask 153 is not formed. Specifically, wet-etching is performed using the SiO$_2$ mask 153 as a mask to remove the second SI-InP current constriction layer 132 from an area where the SiO$_2$ mask 153 is not formed. The wet-etching is performed until the surface of the n-InP channel layer 114 is exposed.

Figure 32:
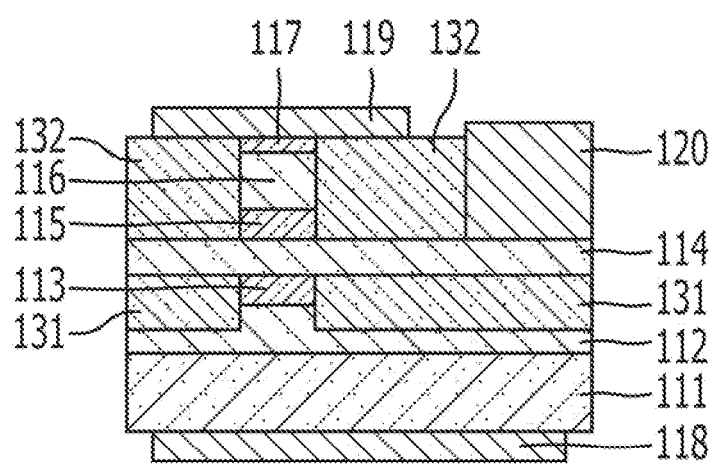

Next, as illustrated in FIG. 32, the SiO$_2$ mask 153 is removed and a common electrode 120 is then formed on the area where the surface of the n-InP channel layer 114 is exposed by the wet-etching. In addition, a light absorption layer electrode 118 is formed on the bottom surface of the p-InP substrate 111 to form a SOA electrode 119 on the contact layer 117.

After separating the chips, an anti-reflection film 141 is formed on the end face on which a signal light beam is incident and an anti-reflection film 142 is formed on the end face from which the signal light beam is output. The anti-reflection films 141 and 142 are formed of dielectric multilayer films, each having a reflectance of 0.1% or less with respect to the wavelength of the signal light beam. Therefore, the semiconductor optical amplifier of the present embodiment illustrated in FIGS. 25A and 25B may be produced.

The semiconductor optical amplifier formed as described above may have a total length of 1000 μm, for example, thereby obtaining substantially the same characteristics as those of the semiconductor optical amplifier of the first embodiment. Furthermore, the semiconductor optical amplifier of the present embodiment includes a multilayered structure of the light absorption layer 113 and the optical amplifier 115, which allows for a smaller design than the semiconductor optical amplifier of the first embodiment.

Furthermore, in the present embodiment, the semiconductor optical amplifier of the present embodiment has been described as one having a structure in which the p-InP cladding layer 112, the light absorption layer 113, the n-InP channel layer 114, the optical amplification layer 115, and the p-InP cladding layer 116 are formed on the p-InP substrate 111. Alternatively, the semiconductor optical amplifier of the present embodiment may be designed as an amplifier having a structure in which the p-InP cladding layer, the optical amplification layer, the n-InP channel layer, the light absorption layer, and the p-InP cladding layer are formed on the P-InP substrate. In this case, the light absorption layer electrode and the SOA electrode are arranged in reverse.

Structural components other than those described above are similar to those of the first embodiment.

Third Embodiment

Figure 33:
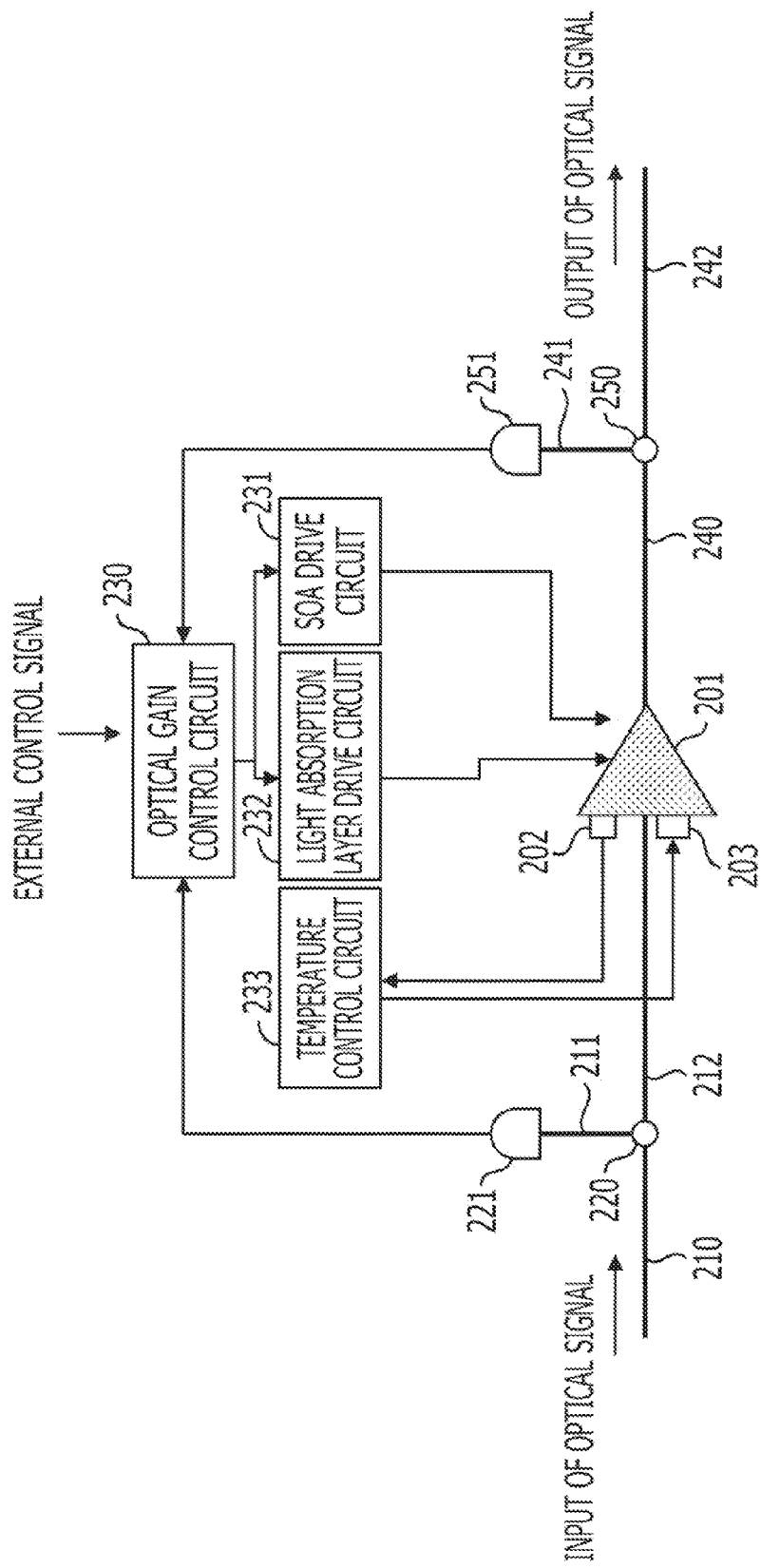
FIG. 33 is a structural diagram of the optical amplification apparatus according to a third embodiment.

Referring now to FIG. 33, a third embodiment will be described. An optical amplification apparatus according to the third embodiment includes the semiconductor optical amplifier of the first or second embodiment. Each of the signal-light input and output sides of an optical amplifier 201 is provided with a lens or the like (not illustrated) and coupled to an optical fiber which will be described later.

The optical amplification apparatus of the present embodiment outputs an input optical signal after amplification thereof. In the optical amplification apparatus of the present invention, a signal light beam input from an optical fiber 210 is split by an optical coupler 220 into a light beam incident on an optical detector 221 through the optical fiber 211 and a light beam incident on a semiconductor optical amplifier 201 through an optical fiber 212. The optical detector 221, which serves as a first optical detector, monitors the power of incident light. An electric signal is generated depending on the strength of light incident on the optical detector 221 and sent to an optical gain control circuit 230. The optical gain control circuit 230 calculates an optical amplification layer driving current (SOA current) and a light absorption layer driving current based on the electric signal sent from the optical detector 221, an electric signal sent from an optical detector 251 which will be described later, and an external control signal from the outside. The control signal based on the calculated optical amplification layer driving current is sent to the SOA driving current 231 from the optical gain control circuit 230. Then, the optical amplification layer driving current controlled by the SOA drive circuit 231 is applied to a semiconductor optical amplifier 201. Furthermore, a control signal based on the calculated light absorption layer driving current is sent from the optical gain control circuit 230 to the light absorption layer drive circuit 232. Then, the light absorption layer driving current controlled by the light absorption layer drive circuit 232 is applied to the semiconductor optical amplifier 201. In the semiconductor optical amplifier 201, the signal light beam entering from an optical fiber 212 through a lens or the like (not illustrated) is amplified and then output to an optical fiber 240 through a lens or the like (not illustrated) in response to the applied optical amplification layer driving current and the light absorption layer driving current. The signal light output from the optical fiber 240 is split by an optical coupler 250 into a light beam incident on an optical detector 251 through an optical fiber 241 and a light beam output from the optical amplification apparatus through an optical fiber 242. The optical detector 251, which serves as a second optical detector, monitors the power of output light. An electric signal is generated depending on the strength of light incident on the optical detector 251 and sent to an optical gain control circuit 230.

In the optical amplification apparatus of the present embodiment, the semiconductor optical amplifier 201 is provided with a thermal sensor unit 202, such as a thermistor, and a thermal control unit 203, such as a thermoelectric cooling element. The thermal sensor unit 202 is capable of measuring and monitoring the temperature of the semiconductor optical amplifier 201. The thermal information measured by the temperature sensor unit 202 is converted into an electric signal and then sent to a temperature control circuit 233. The thermal control unit 233 controls the thermal control unit 203 so that the temperature of the semiconductor optical amplifier 201 maintains a constant temperature in response to the electric signal sent from the thermal sensor unit 202. Specifically, a control signal from the temperature control circuit 233 is sent to the thermal control unit 203. Then, the thermal control unit 203 cools or heats the semiconductor optical amplifier 201 to a certain temperature in response to the control signal.

The optical amplification apparatus of the present embodiment controls various kinds of signal light beams including a WDM signal to make an optical gain constant and performs various kinds of gain controls, such as a control to make an output signal light beam constant.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor optical amplifier comprising:
a semiconductor substrate;
a lower cladding layer formed on the semiconductor substrate;
a light absorption layer and an optical amplification layer formed on the lower cladding layer;
an upper cladding layer formed on the light absorption layer and the optical amplification layer;
a common electrode formed on the bottom surface of the semiconductor substrate;
an optical amplification layer electrode formed in an optical amplification region where the optical amplification layer is formed, through the upper cladding layer; and
a light absorption layer electrode formed in a light absorption region where the light absorption layer is formed, through the upper cladding layer; wherein
a band gap of a semiconductor material that forms the light absorption layer is wider than a band gap of a semiconductor material that forms the optical amplification layer,
the difference between the band gap of the semiconductor material that forms the light absorption layer and the band gap of the semiconductor material that forms the optical amplification layer is 0.12 eV or more, and
the light absorption layer and the optical amplification layer are connected in the light-propagating direction to form an optical waveguide.

2. A semiconductor optical amplifier comprising:
a semiconductor substrate;
a lower cladding layer formed on the semiconductor substrate;
a light absorption layer and an optical amplification layer formed on the lower cladding layer; and
an upper cladding layer formed on the light absorption layer and the optical amplification layer, wherein
a band gap of a semiconductor material that forms the light absorption layer is wider than a band gap of a semiconductor material that forms the optical amplification layer, and
the difference between the band gap of the semiconductor material that forms the light absorption layer and the band gap of the semiconductor material that forms the optical amplification layer is 0.12 eV or more; wherein
the light absorption layer and the optical amplification layer are stacked in the vertical direction to the light-propagating direction, and a channel layer is placed between the light absorption layer and the light amplification layer.

3. The semiconductor optical amplifier according to claim 1, wherein
light enters an end face of the light absorption layer and is output from an end face of the optical amplification layer.

4. The semiconductor optical amplifier according to claim 2, further comprising:
a light absorption layer electrode formed on the bottom surface of the semiconductor substrate;
an optical amplification layer electrode formed on the upper cladding layer, and
a common electrode connected to the channel layer.

5. The semiconductor optical amplifier according to claim 2, wherein
the thickness of the channel layer is 300 nm or less.

6. The semiconductor optical amplifier according to claim 2, wherein
the channel layer is made of a material containing InP.

7. The semiconductor optical amplifier according to claim 2, wherein
among end faces of the light absorption layer and end faces of the light amplification layer, an end face on which light is incident and an end face from which light is output are respectively provided with anti-reflection films.

8. A semiconductor optical amplifier comprising:
a semiconductor substrate;
a lower cladding layer formed on the semiconductor substrate;
a light absorption layer and an optical amplification layer formed on the lower cladding layer; and
an upper cladding layer formed on the light absorption layer and the optical amplification layer, wherein
a band gap of a semiconductor material that forms the light absorption layer is wider than a band gap of a semiconductor material that forms the optical amplification layer, and
the difference between the band gap of the semiconductor material that forms the light absorption layer and the band gap of the semiconductor material that forms the optical amplification layer is 0.12 eV or more; wherein
an optical gain is changed by controlling the amount of current flowing through the light absorption layer while a constant current is flowing through the optical amplification layer.

9. The semiconductor optical amplifier according to claim 8, wherein
the light amplification layer and the optical amplification layer are made of materials containing the same elements with different composition ratios.

10. The semiconductor optical amplifier according to claim 8, wherein
the light absorption layer and the optical amplification layer are made of materials containing InGaAsP or AlGaInAs with different composition ratios.

11. The semiconductor optical amplifier according to claim 8, wherein
the optical amplification layer has a multiple quantum well structure.

12. The semiconductor amplifier according to claim 8, wherein
the light absorption layer is provided with an amount of tensile strain of 0.76% or less.

13. The semiconductor optical amplifier according to claim 8, wherein
the semiconductor substrate is made of a material containing InP.

14. The semiconductor optical amplifier according to claim 8, wherein
the lower cladding layer and the upper cladding layer are made of materials containing InP.

15. An optical amplifier, comprising:
a semiconductor optical amplifier;
a first optical detector to measure the amount of light incident on the semiconductor optical amplifier;
a second optical detector to measure the amount of light output from the semiconductor optical amplifier;
an optical gain control circuit to calculate an amount of current to be applied to a light absorption layer based on the amount of light detected by the first optical detector and the second optical detector; and
a light absorption layer driving circuit to apply a current to the light absorption layer based on the amount of current to be applied to the light absorption layer, wherein
the semiconductor optical amplifier includes:
a semiconductor substrate;
a lower cladding layer formed on the semiconductor substrate;
a light absorption layer and an optical amplification layer formed on the lower cladding layer; and
an upper cladding layer formed on the light absorption layer and the optical amplification layer, wherein
a band gap of a semiconductor material that forms the light absorption layer is larger than a band gap of a semiconductor material that forms the optical amplification layer, and
the difference between the band gap of the semiconductor material that forms the light absorption layer and the band gap of the semiconductor material that forms the optical amplification layer is 0.12 eV or more.

16. The optical amplifier according to claim 15, wherein
the optical gain control circuit further calculates the amount of current to be applied to the optical amplification layer based on the amount of light detected by the first optical detector and the amount of light detected by the second optical detector, and
the optical amplifier further includes an optical amplification layer drive circuit that applies a current to the optical amplification layer based on the amount of current to be applied to the optical amplification layer.

* * * * *